(12) United States Patent
Diao et al.

(10) Patent No.: US 7,289,356 B2
(45) Date of Patent: Oct. 30, 2007

(54) FAST MAGNETIC MEMORY DEVICES UTILIZING SPIN TRANSFER AND MAGNETIC ELEMENTS USED THEREIN

(75) Inventors: Zhitao Diao, Fremont, CA (US); Yiming Huai, Pleasanton, CA (US); Mahendra Pakala, Fremont, CA (US); Zhenghong Qian, Fremont, CA (US)

(73) Assignee: Grandis, Inc., Milpitas, CA (US)

( * ) Notice: Subject to any disclaimer, the term of this patent is extended or adjusted under 35 U.S.C. 154(b) by 133 days.

(21) Appl. No.: 11/147,944

(22) Filed: Jun. 8, 2005

(65) Prior Publication Data

US 2006/0279981 A1 Dec. 14, 2006

(51) Int. Cl.
*G11C 7/00* (2006.01)

(52) U.S. Cl. ........................... 365/158; 365/173

(58) Field of Classification Search ............... 365/158, 365/173
See application file for complete search history.

(56) References Cited

U.S. PATENT DOCUMENTS

2002/0006058 A1  1/2002  Nakajima et al.
2004/0160809 A1*  8/2004  Lin et al. .................. 365/158
2004/0165424 A1*  8/2004  Tsang ........................ 365/171
2004/0165425 A1*  8/2004  Nakamura et al. ......... 365/171
2005/0073897 A1*  4/2005  Miyatake et al. .......... 365/222

OTHER PUBLICATIONS

J.C. Slonczewski, *Current-Driven Excitation of Magnetic Multilayers*, Journal of Magnetism and Magnetic Materials, vol. 59, pp. L1-L7 (1996).

* cited by examiner

*Primary Examiner*—Michael T Tran
(74) *Attorney, Agent, or Firm*—Strategic Patent Group, P.C.

(57) ABSTRACT

A method and system for providing a magnetic memory is described. The method and system include providing a plurality of magnetic storage cells, a plurality of word lines, and a plurality of bit lines. Each of the plurality of magnetic storage cells includes a plurality of magnetic elements and at least one selection transistor. Each of the plurality of magnetic elements is capable of being programmed using spin transfer induced switching by a write current driven through the magnetic element. Each of the plurality of magnetic elements has a first end and a second end. The at least one selection transistor is coupled to the first end of each of the plurality of magnetic elements. The plurality of word lines is coupled with the plurality of selection transistors and selectively enables a portion of the plurality of selection transistors.

49 Claims, 12 Drawing Sheets

FAST MAGNETIC MEMORY DEVICES UTILIZING SPIN TRANSFER AND MAGNETIC ELEMENTS USED THEREIN

FIELD OF THE INVENTION

The present invention relates to magnetic memory systems, and more particularly to a method and system for providing memory cells and accompanying circuitry for use in a magnetic memory having cells that can be switched using a spin transfer effect.

BACKGROUND OF THE INVENTION

FIG. 1 depicts a portion of a conventional magnetic random access memory (MRAM) 10. The conventional MRAM 10 includes conventional magnetic storage cells 20, conventional word lines 30-1 through 30-n, conventional word selection lines 40 and 42, conventional data lines 50 and 52, conventional word selection transistors 54 and 56, conventional data selection line 60, conventional data selection transistor 62, and conventional sense amplifier 70. The conventional magnetic storage cells 20 each include a single conventional selection transistor 22 and a single conventional magnetic element 24. The conventional magnetic element 24 may be a conventional spin valve or a conventional tunneling magnetoresistive (TMR) junction. The word selection line 42 carries a signal that is the inverse of the signal carried by the word selection line 40. Similarly, the data line 50 carries a signal that is the inverse of a signal carried on the data line 52. The conventional MRAM 10 is programmed using the spin-transfer effect.

The spin-transfer effect arises from the spin-dependent electron transport properties of ferromagnetic-normal metal multilayers. When a spin-polarized current traverses a magnetic multiplayer, such as the conventional magnetic element 24, in a CPP configuration, the spin angular momentum of electrons incident on a ferromagnetic layer interacts with magnetic moments of the ferromagnetic layer near the interface between the ferromagnetic and normal-metal layers. Through this interaction, the electrons transfer a portion of their angular momentum to the ferromagnetic layer. As a result, a spin-polarized current can switch the magnetization direction of the ferromagnetic layer if the current density is sufficiently high (approximately $10^6$-$10^8$ A/cm$^2$).

The phenomenon of spin transfer can be used in the CPP configuration as an alternative to or in addition to using an external switching field to switch the direction of magnetization of the free layer of a magnetic element, such as a the conventional spin valve or TMR junction 24.

To program the conventional magnetic element 24 to a first state, such as a logical "1", current is driven through the conventional magnetic element 24 in a first direction. To program the conventional magnetic element 24 to a second state, such as a logical "0", current is driven through the conventional magnetic element 24 in the opposite direction. For example, in order to program the conventional magnetic element 24, the conventional selection transistor 22 is activated by activating the conventional word line 30-1. In addition, word selection transistors 54 and 56 are activated by providing the appropriate voltages on the word selection lines 40 and 42, respectively. The conventional data selection transistor 62 is disabled by providing the appropriate voltage on the data selection line 60. Depending upon the voltage biasing the data lines 50 and 52, current flows through the conventional magnetic element 24 in the first direction or the second direction. Consequently, the state of the conventional magnetic element 24 is switched to a logical "1" or a logical "0", respectively.

To read the conventional magnetic element 24, the conventional selection transistor 22 and the conventional data selection transistor 62 are activated using the lines 30-1 and 60, respectively. In addition, one of the word selection transistors 56 is activated using the word selection line 42, while the remaining word selection transistor 54 is disabled using the word selection line 40. A sense current can thus be driven through the conventional magnetic element 24 to the sense amplifier 70. Depending upon the magnitude of the output voltage, it can be determined by comparing the sense current with to a reference current whether a logical "0" or a logical "1" is stored in the conventional magnetic element 24 and thus the conventional magnetic storage cell 20.

Although magnetic elements utilizing spin transfer as a programming mechanism can be used in principle, one of ordinary skill in the art will readily recognize that there may be drawbacks. In particular, noise from the transistors 22, 54, 56, and 62, from the data lines 50 and 52, and the remaining peripheral circuitry may reduce the signal-to-noise ratio. Consequently, it may be difficult to accurately read the conventional MRAM 10, particularly at higher device densities.

Accordingly, what is needed is a magnetic memory having improved performance and utilizing a localized phenomenon for writing, such as spin transfer, and accompanying circuitry for reading with enhanced signal-to-noise ratio and fast speed. The present invention addresses such a need.

BRIEF SUMMARY OF THE INVENTION

The present invention provides a method and system for providing a magnetic memory. The method and system comprise providing a plurality of magnetic storage cells, a plurality of word lines, and a plurality of bit lines. Each of the plurality of magnetic storage cells includes a plurality of magnetic elements and at least one selection transistor. Each of the plurality of magnetic elements is capable of being programmed using spin transfer induced switching by a write current driven through the magnetic element. Each of the plurality of magnetic elements has a first end and a second end. The at least one selection transistor is coupled to the first end of each of the plurality of magnetic elements. The plurality of word lines is coupled with the plurality of selection transistors and selectively enables a portion of the plurality of selection transistors.

According to the method and system disclosed herein, the present invention provides a mechanism for programming and reading a magnetic memory including magnetic elements that are programmable by a write current driven through the magnetic elements, for example through the phenomenon of spin transfer.

DETAILED DESCRIPTION OF THE INVENTION

Figure 1:
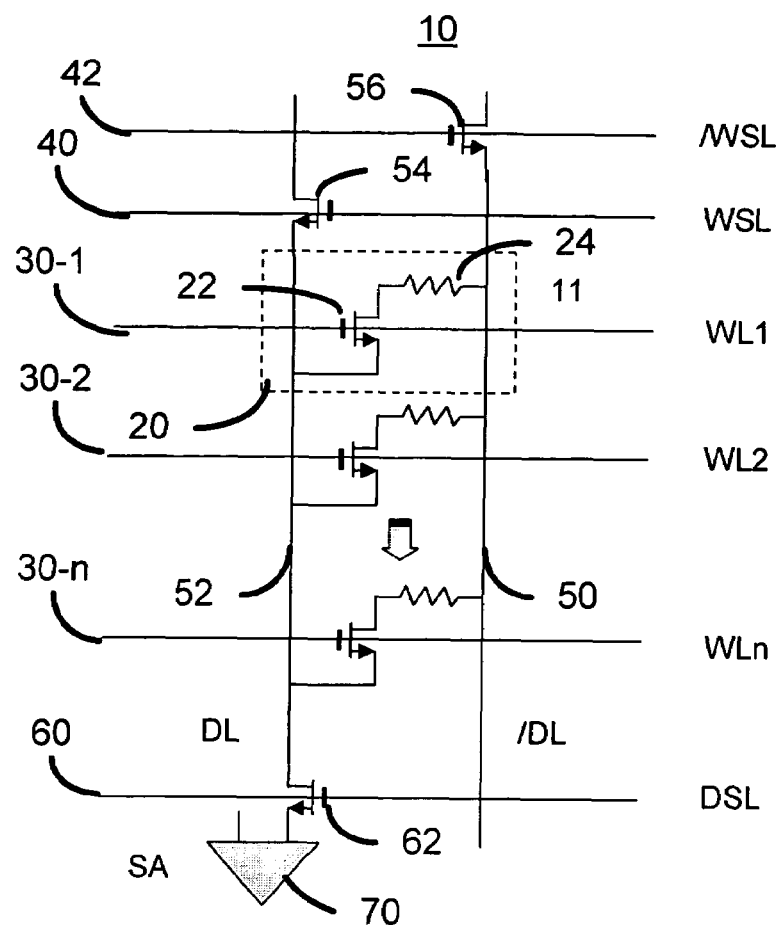
FIG. 1 is a diagram of a conventional magnetic random access memory.

The present invention relates to a magnetic memory. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

The present invention provides a method and system for providing a magnetic memory. The method and system comprise providing a plurality of magnetic storage cells, a plurality of word lines, and a plurality of bit lines. Each of the plurality of magnetic storage cells includes a plurality of magnetic elements and at least one selection transistor. Each of the plurality of magnetic elements is capable of being programmed using spin transfer induced switching by a write current driven through the magnetic element. Each of the plurality of magnetic elements has a first end and a second end. The at least one selection transistor is coupled to the first end of each of the plurality of magnetic elements. The plurality of word lines is coupled with the plurality of selection transistors and selectively enables a portion of the plurality of selection transistors.

The present invention is described in the context of particular magnetic memories having certain components. One of ordinary skill in the art will readily recognize that the present invention is consistent with the use of magnetic memories having other and/or additional components. Furthermore, the present invention is described in the context of components corresponding to certain portions of the memory. For example, subsidiary lines are described as corresponding to a certain number of magnetic storage cells. However, one of ordinary skill in the art will readily recognize that the components could correspond to another number of elements, for example subsidiary lines corresponding to another number of magnetic storage cells. The method and system in accordance with the present invention are also described in the context of reading from or writing to a single magnetic storage cell. However, one of ordinary skill in the art will readily recognize that the method and system can be extended to read from and/or write to multiple magnetic storage cells substantially in parallel. The present invention is described in the context of certain memories. However, one of ordinary skill in the art will readily recognize that the present invention is compatible with memories not inconsistent with the present invention.

The present invention is also described in the context of current understanding of the spin transfer phenomenon. Consequently, one of ordinary skill in the art will readily recognize that theoretical explanations of the behavior of the method and system are made based upon this current understanding of spin transfer. One of ordinary skill in the art will also readily recognize that the method and system are described in the context of a structure having a particular relationship to the substrate. For example, as depicted in the drawings, the bottoms of the structures are typically closer to an underlying substrate than the tops of the structures. However, one of ordinary skill in the art will readily recognize that the method and system are consistent with other structures having different relationships to the substrate. In addition, the method and system are described in the context of certain layers being synthetic and/or simple. However, one of ordinary skill in the art will readily recognize that the layers could have another structure. Furthermore, the present invention is described in the context of magnetic elements having particular layers. However, one of ordinary skill in the art will readily recognize that magnetic elements having additional and/or different layers not inconsistent with the present invention could also be used. Moreover, certain components are described as being ferromagnetic. However, as used herein, the term ferromagnetic could include ferrimagnetic or like structures. Thus, as used herein, the term "ferromagnetic" includes, but is not limited to ferromagnets and ferrimagnets.

Figure 2:
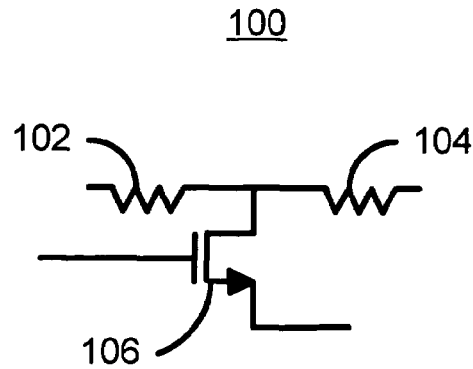
FIG. 2 is a diagram of a portion of one embodiment of a magnetic storage cell in accordance with the present invention.

FIG. 2 is a diagram of a portion of one embodiment of a magnetic storage cell 100 in accordance with the present invention. The magnetic storage cell 100 includes magnetic elements 102 and 104 as well as selection transistor 106 that is shared by the magnetic elements 102 and 104. The selection transistor 106 is enabled in order to select the magnetic storage cell 100. The magnetic elements 102 and 104 are programmed by driving a write current through the magnetic elements 102 and 104. Thus, the magnetic elements 102 and 104 are programmed using spin transfer. The magnetic elements 102 and 104 provide a signal via magnetoresistance. In a preferred embodiment, the magnitudes of the magnetoresistances of the magnetic elements 102 and 104 are substantially equal. In addition, the data storage layer (preferably at least one free layer) of the magnetic elements 102 and 104 preferably have their magnetizations aligned antiparallel. In one embodiment, the magnetic elements 102 and 104 may be TMR junctions, dual TMR junctions, or other magnetic element, such as those described below, which can be programmed using spin transfer and which provide a read signal using magnetoresistance. The selection transistor 106 is preferably a CMOS transistor.

As discussed above, the magnetizations of the data storage layers for the magnetic elements 102 and 104 are aligned antiparallel. Suppose that the magnetic elements 102 and 104 have at least one data storage layer (e.g. free layer) and at least one reference (e.g. pinned) layer. Based on the writing operation, the magnetization of the recording layer of the magnetic element 102 is directed parallel to that of the reference (pinned) layer. In addition, the magnetization of the data storage layer (e.g. free layer) of the magnetic element 104 is directed anti-parallel to that of the reference layer (e.g. pinned layer) in a direction of the switching current. This magnetization configuration represents a logical "1". If the switching current is driven in the opposite direction, the magnetizations of the storage layers of the magnetic elements 102 and 104 are reversed. Consequently, the magnetization of the data storage layer of the TMR element 102 is directed anti-parallel to that of the reference (pinned) layer, while the magnetization of the recording layer of the magnetic element 104 is directed parallel to that of the reference layer. This configuration represents a logical "0".

During reading, a potential difference is applied between the ends of each of the magnetic elements 102 and 104. The output is a differential signal. The magnitude of the difference in the currents flowing through the lines coupled to the ends of the magnetic elements 102 and 104 is indicative of the data stored in the magnetic storage cell 100. In a preferred embodiment, the resistances of the magnetic elements 102 and 104 are R(1−MR/2) and R(1+MR/2), respectively, for a logical "1" described above. Thus, although the resistances differ, the magnetoresistances are preferably the same. Currents $I_{102}$ and $I_{104}$ flowing through magnetic elements 102 and 104, respectively, for a particular bias voltage, $V_{bias}$. Thus, $I_{102}$ is $V_{bias}/[R(1−MR/2)]$ while $I_{104}$ is $V_{bias}/[R(1+MR/2)]$ for a logical "1". Thus, $I_{102}$ is larger than $I_{104}$ for a logical "1". Similarly, when a logical "0" is stored, $I_{102}$ is smaller than $I_{104}$. In a preferred embodiment, where the magnetoresistances of the magnetic elements 102 and 104 are the same, the difference in the currents $I_{102}$ and $I_{104}$ is $V_{bias}/R×MR$. Thus, the magnetic storage cell may provide a larger signal than for a conventional magnetic memory. In addition, because the magnetic elements 102 and 104 share one selection transistor 106, the noise from the fluctuation in the characteristics of the transistor 106 can be reduced or eliminated. Consequently, performance may be improved.

Figure 3:
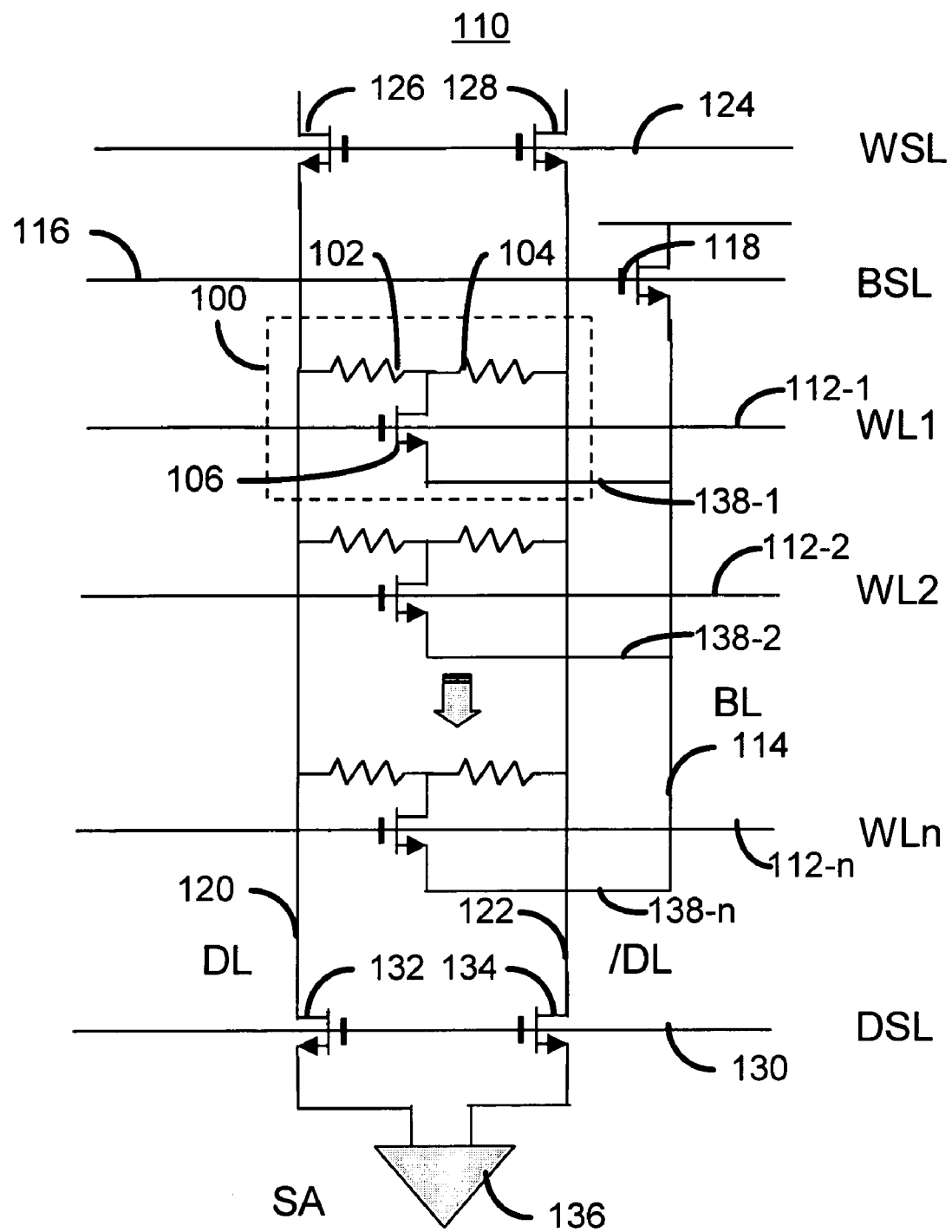
FIG. 3 is a diagram of a portion of one embodiment of a magnetic memory in accordance with the present invention.

FIG. 3 is a diagram of a portion of one embodiment of a magnetic memory 110 in accordance with the present invention. The magnetic memory 110 utilizes magnetic storage cells 100. The magnetic memory 110 includes word lines 112-1 through 112-n, bit line 114, bit select line 116, bit select transistor 118, data line 120, data line 122 that carries a signal that is the inverse of the signal carried on the data line 120, word select line 124, word select transistors 126 and 128, data select line 130, data select transistors 132 and 134, sense amplifier 136, and bit line segments 138-1 through 138-n. The bit line segments 138-1 through 138-n couple the storage cells 100 to the bit line 114. The word select line 124 is used to enable word select transistors 126 and 128. The data select line 130 is used to enable data select transistors 132 and 134. One end of each of the magnetic elements 102 and 104 is connected to the selection transistor 106. The other end of the magnetic elements 102 and 104 are coupled to the data lines 120 and 122, respectively. Bias voltage clamping circuits (not shown) are coupled with the data lines 120 and 122 for programming operations and to the bit line 114 for read operations. The transistors 118, 126, 128, 132, and 134 may be CMOS transistors. In the magnetic memory 110, the magnetic storage cells 100 operate analogously to the magnetic storage cell 100 depicted in FIG. 2. In a preferred embodiment, the resistances are different and the magnetoresistances are the same for both magnetic elements 102 and 104.

In operation, the magnetic memory 110 is programmed by driving a write current through the magnetic elements 102 and 104 to switch the magnetization of the data storage layer using the spin transfer effect. To program a cell, such as the cell coupled with the word line 112-1, the cell is activated by activating the selection transistor 106 using the word line 112-1. In addition, the bit select transistor 118 and word select transistors 126 and 128 are activated using the bit selection line 116 and the word select line 124, respectively. The data select transistors 132 and 134 are also disabled using the data select line 130. Data can be programmed to the magnetic elements 102 and 104 by flowing a current through the magnetic elements 102 and 104 in the appropriate direction by setting a high voltage (e.g. $V_{DD}$) to data lines 120 and 122 and a low voltage (e.g. 0) to bit line 114 or vice versa.

As discussed above, the magnetizations of the data storage layers for the magnetic elements 102 and 104 are aligned antiparallel. During the programming operation when the current is driven in a first direction, the magnetization of the data storage layers of the magnetic elements 102 and 104 are preferably aligned parallel and antiparallel, respectively to that of their reference layers. This configuration represents a logical "1". If the switching current is reversed and the magnetizations of both of the storage layers of the magnetic elements 102 and 104 are reversed, the configuration for a logical "0" is achieved.

The magnetic storage cell 100 is read by activating the selection transistor 106 using the word line 112-1. In addition, data selection transistors 132 and 134 and bit selection transistor 118 are activated using lines 130 and 116, respectively. The word selection transistors 126 and 128 are turned off. In addition, a bias voltage is applied between the data lines 120 and 122 and the bit line 114. As discussed above, if the current through the data line 120 is larger than the current through the data line 122, then a logical "1" is stored in the magnetic storage cell 100. Similarly, if the current through the data line 120 is smaller than the current through the data line 122, then a logical "0" is stored in the magnetic storage cell 100. As discussed above, the current difference for the magnetic elements 102 and 104 having the same magnetoresistance is $V_{bias}/R×MR$, where $V_{bias}$ is the bias voltage, R(1−MR/2) and R(1+MR/2) are the resistances of the magnetic elements 102 and 104, and MR is the magnetoresistance of the magnetic elements 102 and 104.

Thus, the magnetic memory 110 provides a larger signal, which is desirable when reading a memory. Because both magnetic elements 102 and 104 share a single selection transistor 106, all the noise from the fluctuation in the characteristics of additional selection transistors (not present) can be reduced or eliminated. Furthermore, the time delay due to the stray capacitance of the data line 120 or 122 is preferably on the order of less than one nano-second. Consequently, the speed of the magnetic memory 110 is improved. Note, however, that remaining, unselected cells in a column may act as a shunt between the data lines 120 and 122. In such a case, the difference in currents and, therefore, the signal, may be decreased, significantly depending on the wiring resistance of the data lines. For example, in some embodiments, it is expected that a few thousand magnetic storage cells 100 may be coupled in a cell block without unduly affecting performance.

Figure 4:
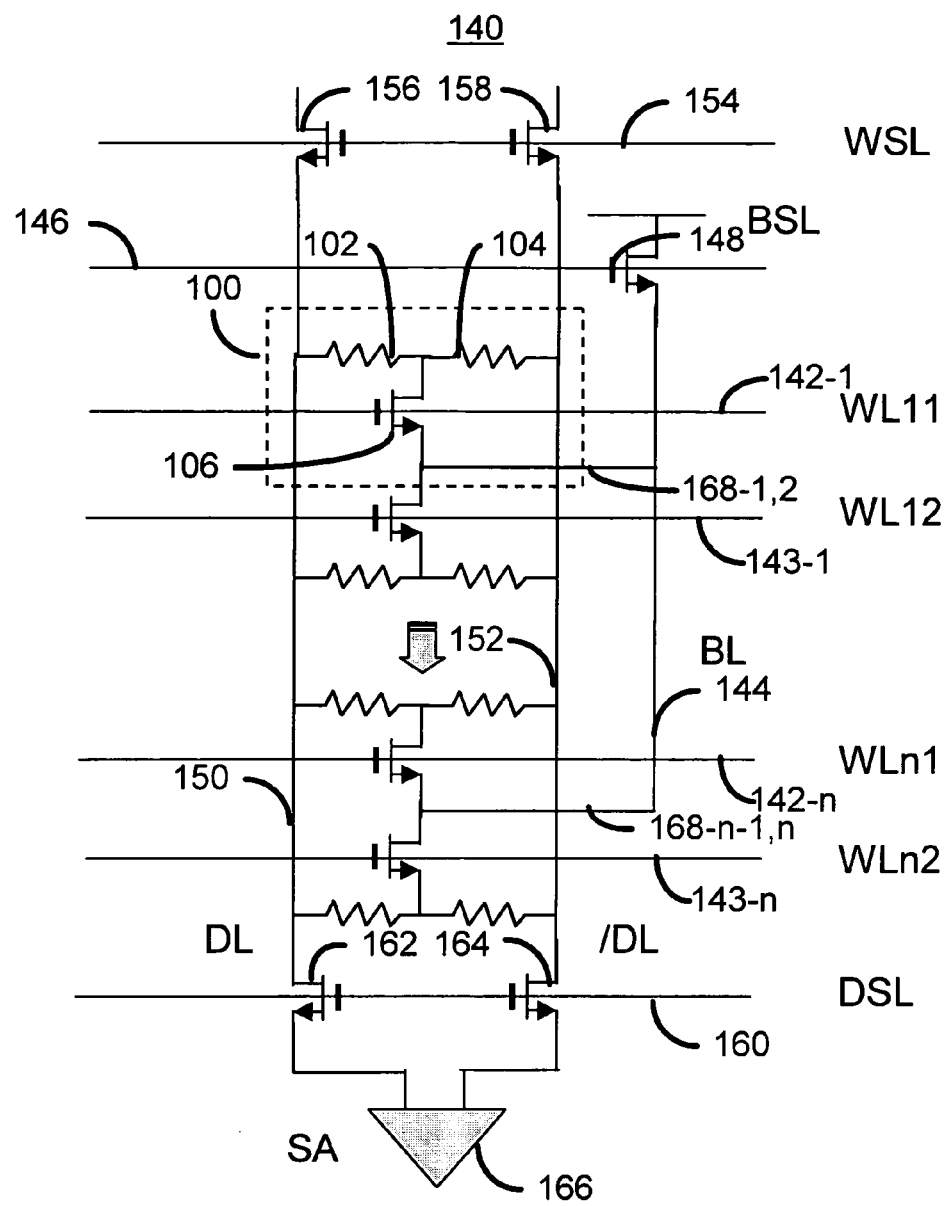
FIG. 4 is a diagram of a portion of another embodiment of a magnetic memory in accordance with the present invention.

FIG. 4 is a diagram of a portion of another embodiment of a magnetic memory 140 in accordance with the present invention. The magnetic memory 140 utilizes magnetic storage cells 100. The magnetic memory 140 includes word lines 142-1 through 142-n, bit line 144, bit select line 146, bit select transistor 148, data line 150, data line 152 that carries a signal that is the inverse of the signal carried on the data line 150, word select line 154, word select transistors 156 and 158, data select line 160, data select transistors 162 and 164, sense amplifier 166, and bit line segments 168-1,2 through 168-n-1,n. The bit line segments 168-1,2 through 168-n-1,n couple the storage cells 100 to the bit line 144. The word select line 154 is used to enable word select transistors 156 and 158. The data select line 160 is used to enable data select transistors 162 and 164. One end of each of the magnetic elements 102 and 104 is connected to the selection transistor 106. The other end of the magnetic elements 102 and 104 are coupled to the data lines 150 and 152, respectively. Bias voltage clamping circuits (not shown) are coupled with the data lines 150 and 152 for programming operations and to the bit line 144 for read operations. The transistors 148, 156, 158, 162, and 164 may be CMOS transistors.

The magnetic memory 140 is analogous to the magnetic memory 110 depicted in FIG. 3. The magnetic memory 140 of FIG. 4 also operates in an analogous manner to the magnetic memory 110 depicted in FIG. 3. In the magnetic memory 140, the magnetic storage cells 100 operate analogously to the magnetic storage cell 100 depicted in FIG. 2. In a preferred embodiment, the resistances differ and magnetoresistances are the same for both magnetic elements 102 and 104. Consequently, the magnetic memory 140 shares many of the advantages of the magnetic memory 110. In addition, in the magnetic memory 140, the magnetic storage cells 100 are grouped into pairs. A pair of magnetic storage cells 100 is grouped such that the selection transistors 106 in a pair share a drain as well as a segment 168-i,j connecting the magnetic storage cells 100 to the bit line 144. Thus, for example, the segment 168-1,2 is coupled to the drains of the selection transistors 106 of the first two magnetic storage cells. The number of segments 168-i,j is, therefore, n/2. Consequently, the number of segments 168-i,j coupling the magnetic storage cells to the bit line 144 is reduced by half. As a result, the density of the magnetic memory 140 can be significantly increased.

Figure 5:
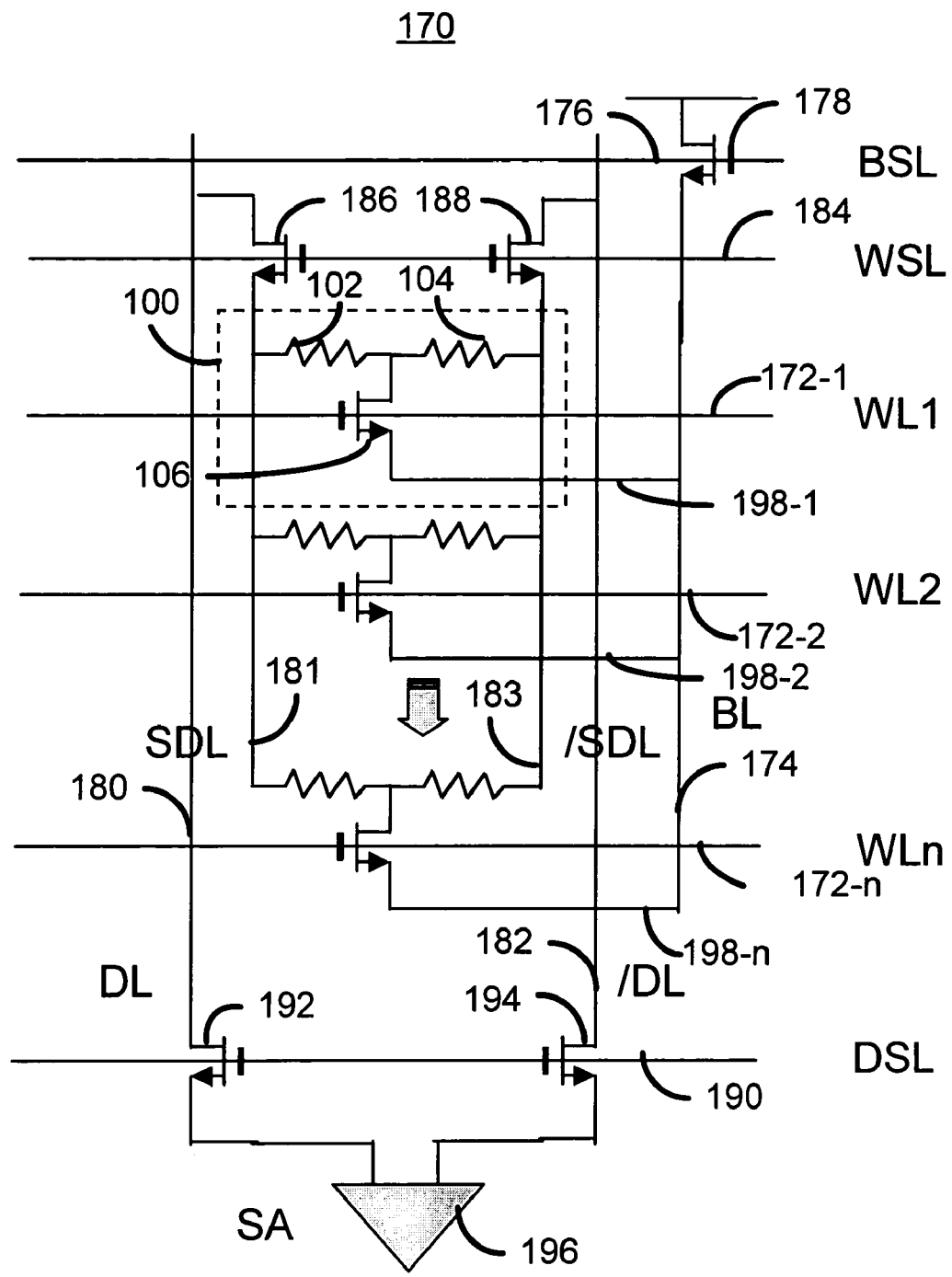
FIG. 5 is a diagram of a portion of another embodiment of a magnetic memory in accordance with the present invention.

FIG. 5 is a diagram of a portion of another embodiment of a magnetic memory 170 in accordance with the present invention. The magnetic memory 170 utilizes magnetic storage cells 100. The magnetic memory 170 includes word lines 172-1 through 172n, bit line 174, subsidiary bit select line 176, subsidiary bit select transistor 178, data line 180, data line 182 that carries a signal that is the inverse of the signal carried on the data line 180, subsidiary data line 181, subsidiary data line 183 that carries a signal that is the inverse of the signal carried on the subsidiary data line 181, word select line 184, word select transistors 186 and 188, data select line 190, data select transistors 192 and 194, sense amplifier 196, and bit line segments 198-1 through 198n. The bit line segments 198-1 through 198n couple the storage cells 100 to the bit line 174. The word select line 184 is used to enable word select transistors 186 and 188. The data select line 190 is used to enable data select transistors 192 and 194. One end of each of the magnetic elements 102 and 104 is connected to the selection transistor 106. The other end of the magnetic elements 102 and 104 are coupled to the data lines 180 and 182, respectively. Bias voltage clamping circuits (not shown) are coupled with the data lines 180 and 182 for programming operations and to the bit line 174 for read operations. The transistors 178, 186, 188, 192, and 194 may be CMOS transistors. In the magnetic memory 170, the magnetic storage cells 100 operate analogously to the magnetic storage cell 100 depicted in FIG. 2. In a preferred embodiment, the resistances differ, while the magnetoresistances are the same for both magnetic elements 102 and 104.

The magnetic memory 170 is analogous to the magnetic memory 110 depicted in FIG. 3. The magnetic memory 170 of FIG. 5 also operates in an analogous manner to the magnetic memory 110 depicted in FIG. 3. Consequently, the magnetic memory 170 shares many of the advantages of the magnetic memory 110. In addition, subsidiary bit line 176 and subsidiary data lines 181 and 183 are used. The subsidiary data lines 181 and 183 are connected to data lines 180 and 182 via selection transistors 186 and 188, respectively. Similarly, the subsidiary bit selection line 176 is coupled to the bit line 174 through a selection transistor 176. The ends of the magnetic elements 102 and 104 are coupled to the subsidiary data lines 181 and 183 instead of data lines. The magnetic elements 102 and 104 are still connected to the selection transistor 106 at the other end. The subsidiary data lines 181 and 183 are utilized to form a subsidiary array having a reduced number of magnetic storage cells 100 without greatly increasing the total area occupied by the magnetic memory 100. Through the use of the subsidiary array, the subsidiary data lines 181 and 183, and the subsidiary bit line 176, as well as the resulting decrease in the number of magnetic storage cells 100 in the subsidiary array, the decrease in output signal due to an increased number of memory cells may be avoided.

Figure 6:
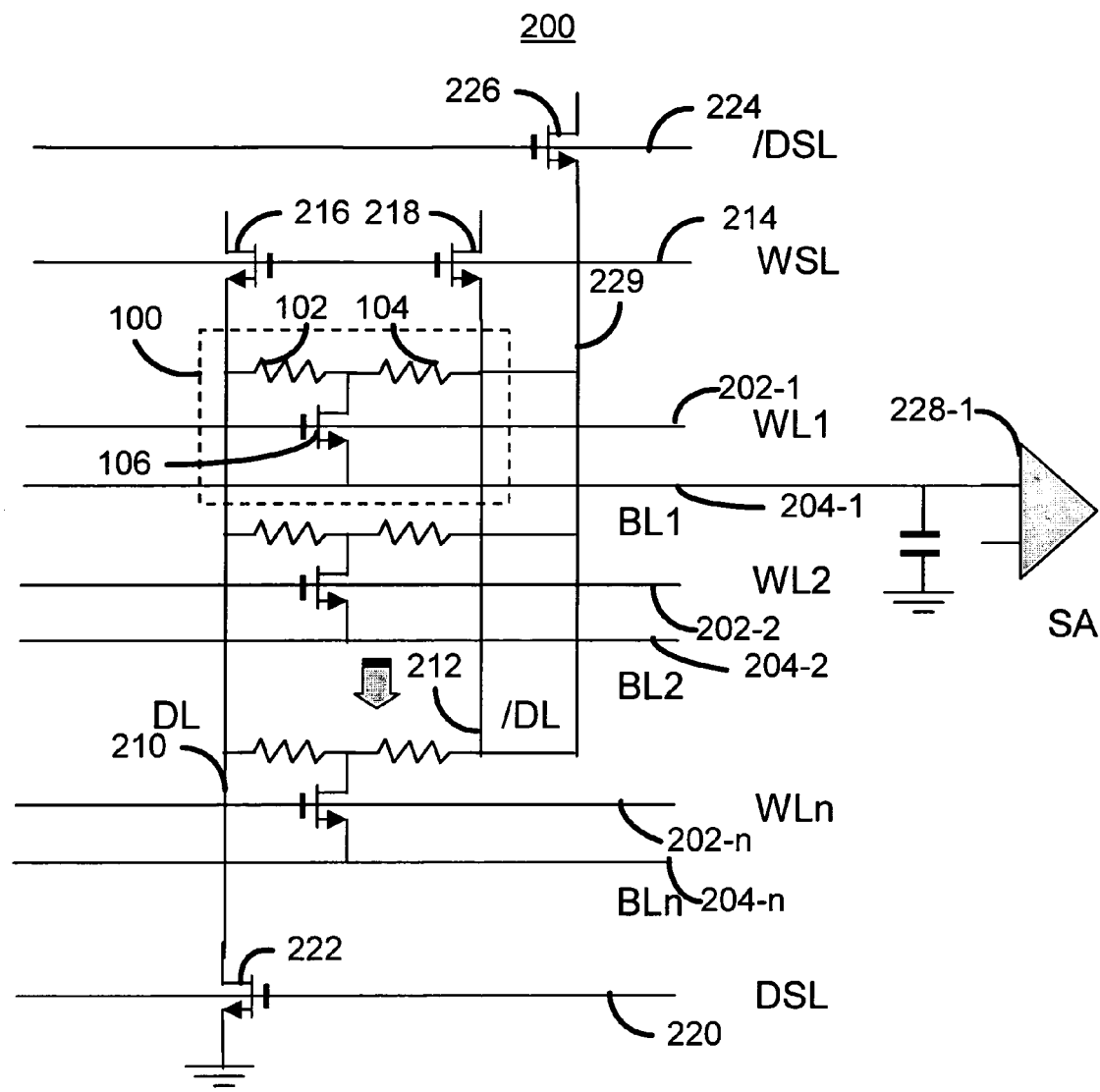
FIG. 6 is a diagram of a portion of another embodiment of a magnetic memory in accordance with the present invention.

FIG. 6 is a diagram of a portion of another embodiment of a magnetic memory 200 in accordance with the present invention. The magnetic memory 200 utilizes magnetic storage cells 100. The magnetic memory 200 includes word lines 202-1 through 202n, bit lines 204-1 through 204n, data line 210, data line 212 that carries a signal that is the inverse of the signal carried on the data line 210, word select line 214, word select transistors 216 and 218, data select line 220, data select line 224 that carries a signal that is the inverse of the signal carried on the data select line 220, data select transistors 222 and 226, sense amplifiers 228-1 through 228n, and additional data line 229 that carries a signal that is the inverse of the signal carried on the data select line 220. The word select line 214 is used to enable word select transistors 216 or 218. The data select lines 220 and 224 are used to enable data select transistors 222 and 226, respectively. One end of each of the magnetic elements 102 and 104 is connected to the selection transistor 106. The other end of the magnetic elements 102 and 104 are coupled to the data lines 210 and 212, respectively. Bias voltage clamping circuits (not shown) are coupled with the data lines 210 and 212 for programming operations. The transistors 216, 218, 222, and 226 may be CMOS transistors.

The magnetic memory 200 is analogous to the magnetic memory 110 depicted in FIG. 3. For programming, the magnetic memory 200 of FIG. 6 also operates in an analogous manner to the magnetic memory 110 depicted in FIG. 3. Consequently, the magnetic memory 200 shares many of the advantages of the magnetic memory 110. In addition, in the magnetic memory 200, the data line 210 is grounded. Individual bit lines 204-1 through 204n are individually coupled with separate differential sense amplifiers 228-1 through 228n. For reading, the selection transistor 106 is enabled using the word line 202-1. In addition, the data selection transistors 222 and 226 are enabled using data selection lines 220 and 224, respectively. Moreover, the word selection transistors 216 and 218 are disabled. A bias voltage is applied to the magnetic storage cell 100 through the data line 229.

In the magnetic memory 200, the magnetic storage cells 200 operate analogously to the magnetic storage cell 100 depicted in FIG. 2. In a preferred embodiment, the resistances are different, while the magnetoresistances are the same for both magnetic elements 102 and 104. Referring back to FIG. 6, for a logical "1" stored in the magnetic storage cell 100, the resistance is R(1−MR/2) for the magnetic element 102 and R(1+MR/2) for the magnetic element 104. Consequently, the voltage induced on the bit line 204-1 is $V_{bias}/2 \times (1-MR/2)$. For such an embodiment, the voltage induced to the bit line 204-1 is $V_{bias}/2 \times (1+MR/2)$ for a logical "0". In one embodiment, a reference voltage is set to $V_{REF}=V_{bias}/2$. In such an embodiment, the logical "0" and the logical "1" can be differentiated by comparing the signal voltage with the reference voltage. Thus, in addition to the benefits provided by the magnetic memory 110, the output signal is not dependent upon the current through the magnetic elements 102 and 104. The output signal thus does not depend on a current that would be changed due to the number of the cells in a cell array. Consequently, the reduction in magnetoresistance ratio depending on the bias voltage can be mitigated. Moreover fluctuations in the characteristics of the selection transistor 106 may not adversely affect performance of the magnetic memory 200.

Figure 7:
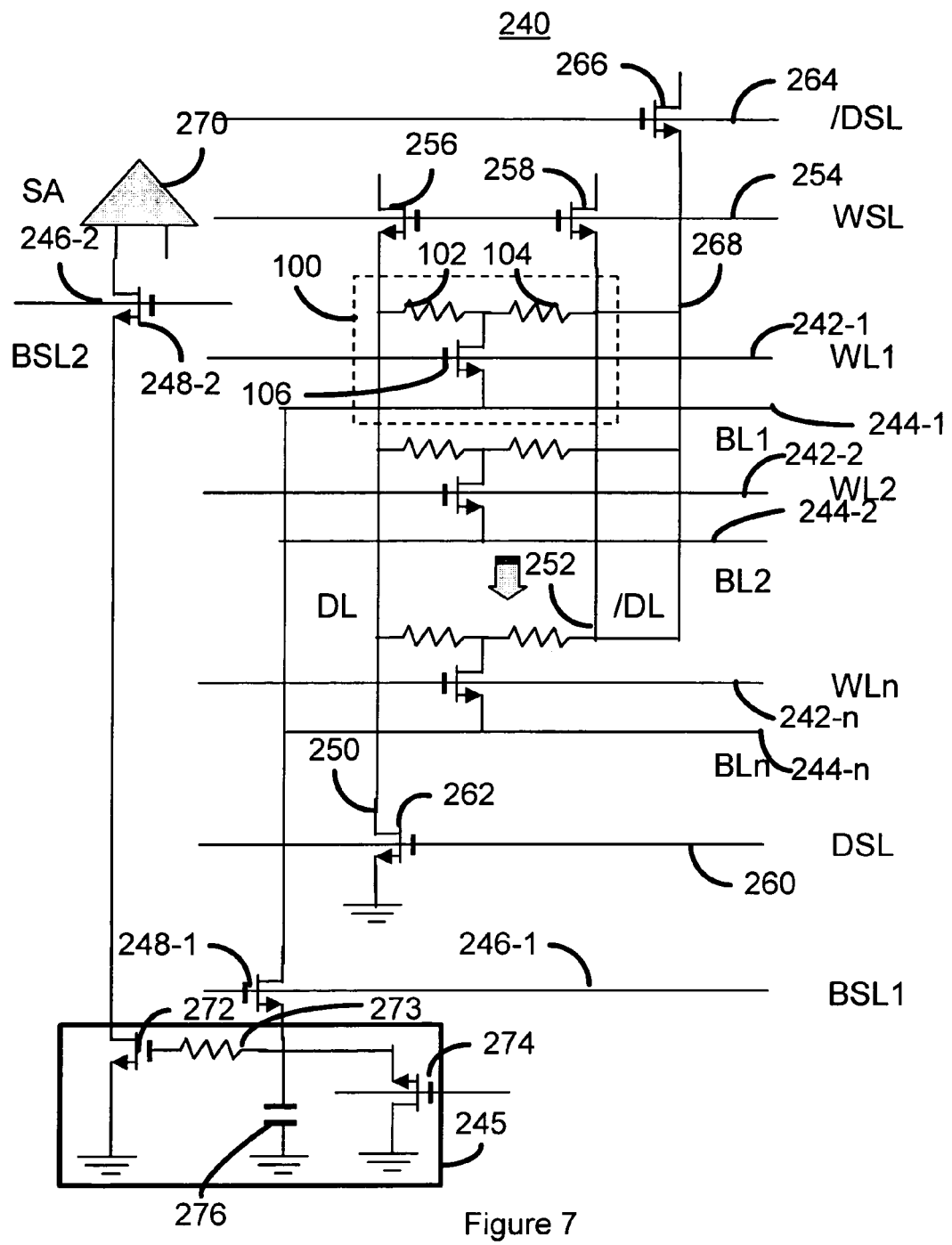
FIG. 7 is a diagram of a portion of another embodiment of a magnetic memory in accordance with the present invention.

FIG. 7 is a diagram of a portion of another embodiment of a magnetic memory 240 in accordance with the present invention. The magnetic memory 240 utilizes magnetic storage cells 100. The magnetic memory 240 includes word lines 242-1 through 242n, bit lines 244-1 through 244n, current converting circuit 245, bit select lines 246-1 through 246n (note that for simplicity only 246-1 and 246-2 are depicted), bit select transistors 248-1 through 248n (not that for simplicity only 248-1 and 248-2 are shown), data line 250, data line 252 that carries a signal that is the inverse of the signal carried on the data line 250, word select line 254, word select transistors 256 and 258, data select line 260, data select line 264 that carries a signal that is the inverse of the signal carried on the data select line 260, data select transistors 262 and 266, additional data line 268 that carries a signal that is the inverse of the signal carried on the data select line 250, sense amplifiers 270, and current converting circuit 245. The current converting circuit 245 includes a resistor 273 transistors 272 and 274, and capacitor 276. The word select line 254 is used to enable word select transistors 256 and 258. The data select lines 260 and 264 are used to enable data select transistors 262 and 266, respectively. One end of each of the magnetic elements 102 and 104 is connected to the selection transistor 106. The other end of the magnetic elements 102 and 104 are coupled to the data line 250 and data lines 252 and 268, respectively. Bias voltage clamping circuits (not shown) are coupled with the data lines 250 and 252 for programming operations and data line 268 for reading. The transistors 248-1 through 248n, 256, 258, 262, 266, 272, and 274 may be CMOS transistors. In a preferred embodiment, the resistances are different and magnetoresistance are the same for both magnetic elements 102 and 104.

The magnetic memory 240 is analogous to the magnetic memory 110 depicted in FIG. 3 as well as the magnetic memory 200 depicted in FIG. 6. For programming, the magnetic memory 240 of FIG. 7 also operates in an analogous manner to the magnetic memory 110 depicted in FIG. 3. For reading, the magnetic memory 240 operates analogously to the magnetic memory 200 depicted in FIG. 6. Referring back to FIG. 7, the magnetic memory 240 thus shares many of the advantages of the magnetic memories 110 and 200. In addition, the bit lines 244-1 through 244n are coupled to at least one current converting circuit 245. A fluctuation of the voltage in the read operation is converted to a current difference in the current converting circuit 245 and provided to an amplifier 270 via the bit line 244-1 through 244n for the corresponding magnetic storage cell 100. In addition, the delay due to the bit lines 244-1 through 244n can be reduced by shortening the bit lines 244-1 through 244n. As a result, the floating capacity and wiring resistance are reduced. Consequently, the speed of the magnetic memory 240 may be improved.

Figure 8:
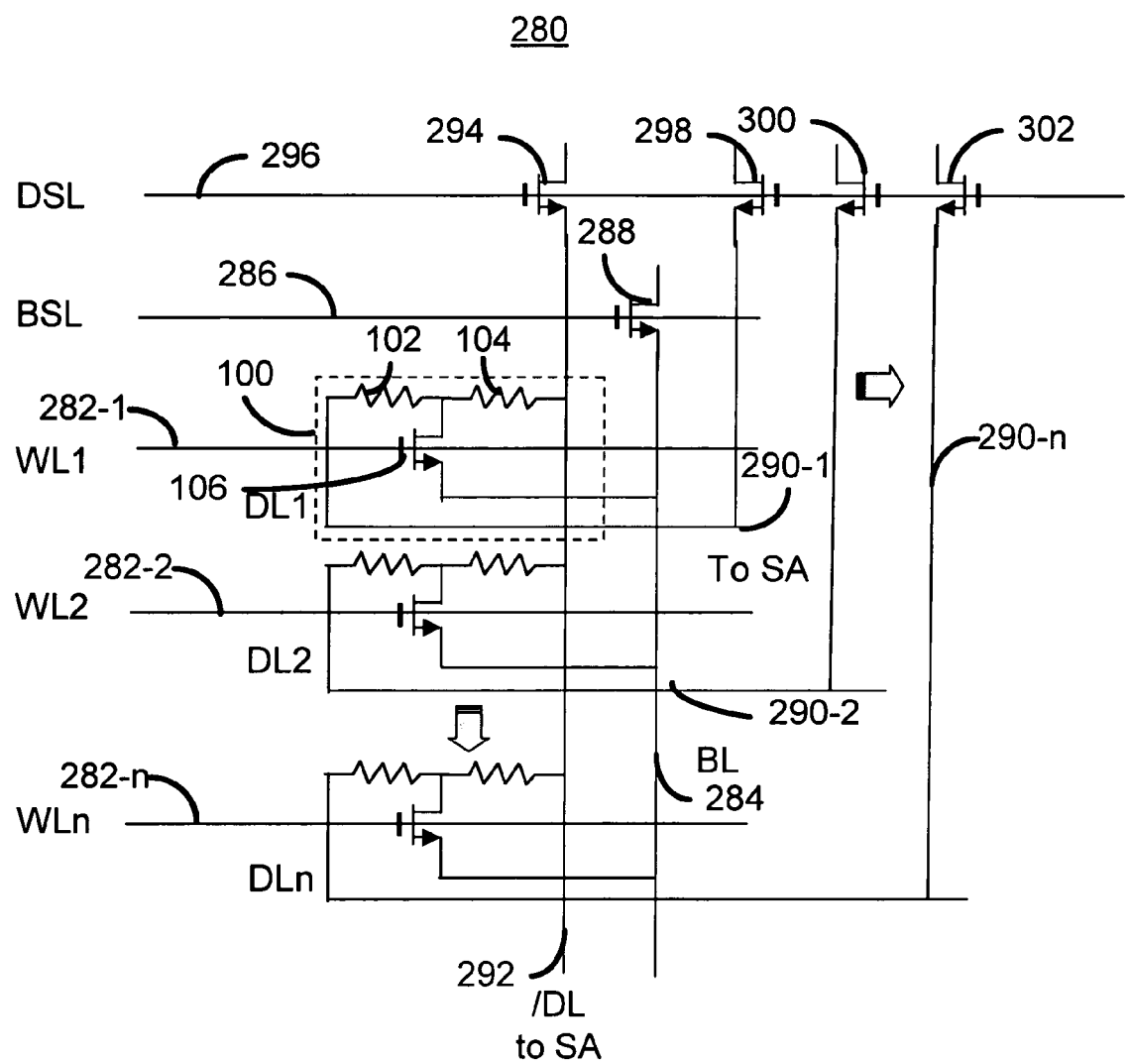
FIG. 8 is a diagram of a portion of another embodiment of a magnetic memory in accordance with the present invention.

FIG. 8 is a diagram of a portion of another embodiment of a magnetic memory 280 in accordance with the present invention. The magnetic memory 280 utilizes magnetic storage cells 100. The magnetic memory 280 includes word lines 282-1 through 282n, bit line 284, bit select line 286, bit select transistors 288, data lines 290-1 through 290n, data line 292 that carries a signal that is the inverse of the signal carried on the data line 290-1 through 290n, additional data line 292, data select line 296, and transistors 294, 298, 300, and 302, etc., which are enabled using the data select line 296. One end of each of the magnetic elements 102 and 104 is connected to the selection transistor 106. The other end of the magnetic elements 102 and 104 are coupled to the data lines 290-1 through 290n, 292, respectively. Bias voltage clamping circuits (not shown) are coupled with the data lines 290-1 through 290n and 292 for programming operations and data line 284 for reading. The transistors, such as transistors 288, 294, 298, 300, and 302, may be CMOS transistors. In a preferred embodiment, the resistances differ, while magnetoresistances are the same for both magnetic elements 102 and 104.

The magnetic memory 280 is analogous to the magnetic memory 110 depicted in FIG. 3. Referring back to FIG. 7, the magnetic memory 280 thus shares many of the advantages of the magnetic memories 110 and 200. In addition, in the magnetic memory 280, one end of the magnetic element 102 is connected to separate data line 290-1 through 290n. The other end of the magnetic element 104 to the common data line 292. All the data lines 290-1 through 290n are connected to corresponding selection transistors such as selection transistors 298, 300, and 302, that are activated only during programming of the corresponding. Similarly, the common data line 292 is connected to the selection transistor 294 that is only activated during writing information operation. One extra transistor, such as transistors 298, 300, and 302, for each storage cell 100 is used for separating the memory cells from each other at expense of device density. During readout of information, the data lines 290-1 through 290n and 292 are not short-circuited by unselected cells. Thus operation with stability and high power consumption efficiency can be expected.

FIGS. 9-16 depict various embodiments of magnetic storage cells 100 that may be used in the magnetic memories 110, 140, 170, 200, 240, and 280. However, other magnetic storage cells and more particularly other magnetic elements might be used.

Figure 9:
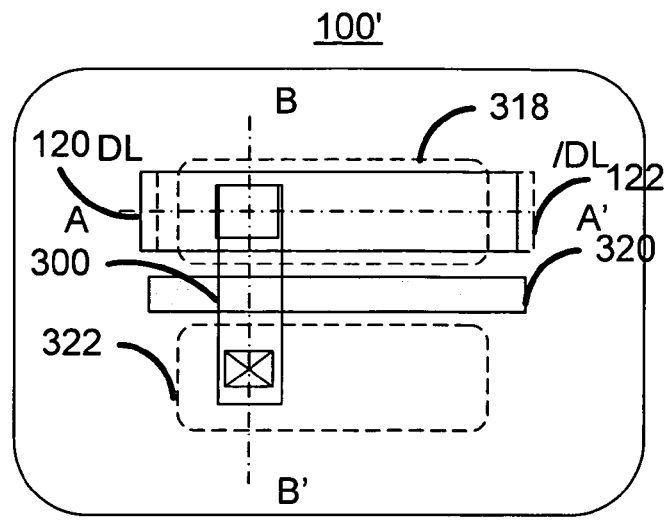
FIG. 9 is a diagram of a portion of one embodiment of a magnetic storage cell in accordance with the present invention.
Figure 10:
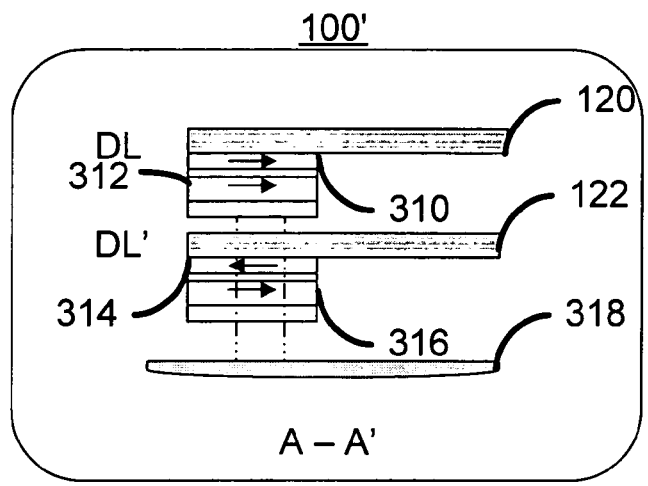
FIG. 10 is a cross-sectional view of a portion of one embodiment of a magnetic storage cell in accordance with the present invention.
Figure 11:
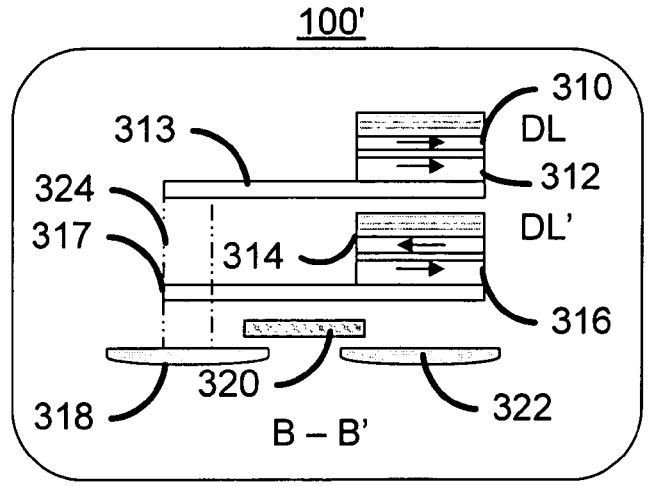
FIG. 11 is a cross-sectional view of a portion of one embodiment of a magnetic storage cell in accordance with the present invention.

FIGS. 9-11 are a diagram of a portion of one embodiment of a magnetic storage cell 100' in accordance with the present invention. FIG. 9 depicts a plan view of the magnetic storage cell 100'FIG. 10 is a cross-sectional view taken along line A-A' of a portion of one embodiment of a magnetic storage 100 cell in accordance with the present invention. FIG. 11 is a cross-sectional view taken along line B-B' of a portion of one embodiment of a magnetic storage cell in accordance with the present invention. The magnetic elements 102' and 104' as well as the selection transistor 106' are depicted. In particular, the source 322, drain 318 and gate 320 of the selection transistor 106' as well as the ferromagnetic layers 310 and 312 of the magnetic element 102' and the ferromagnetic layers 314 and 316 of the magnetic element 104' are shown. In addition, cell plates 313 and 317 for the magnetic elements 102' and 104', respectively, are shown. Moreover, it can be seen from FIGS. 9-11 that the magnetizations of the storage layers of the magnetic elements 102' and 104' are aligned antiparallel. For clarity, the magnetic storage cell 100' is depicted in the context of the magnetic memory 110. Consequently, data lines 120' and 122' are also shown.

As can be seen in FIGS. 9-11, the magnetic elements are preferably formed on the top layer of semiconductor circuitry on a Si substrate. In addition, a cell plate 313 and 317 resides at the bottom of each magnetic element 102' and 104', respectively. The cell plates 313 and 317 are connected to the drain region 318 via a 324 contact. The source region 322 is shared with memory cell of the adjacent memory cell array, and is connected to a bit line. Because the two magnetic elements 102' and 104' share one selection transistor 106', it is possible to reduce a region occupied by the magnetic storage cell 100' by fabricating one magnetic element 102'/104' on top of the other magnetic element 104'/102'. This reduction is by approximately a factor of two, in comparison with a magnetic storage cell (not shown) in which two magnetic elements might have their own transistors.

Figure 12:
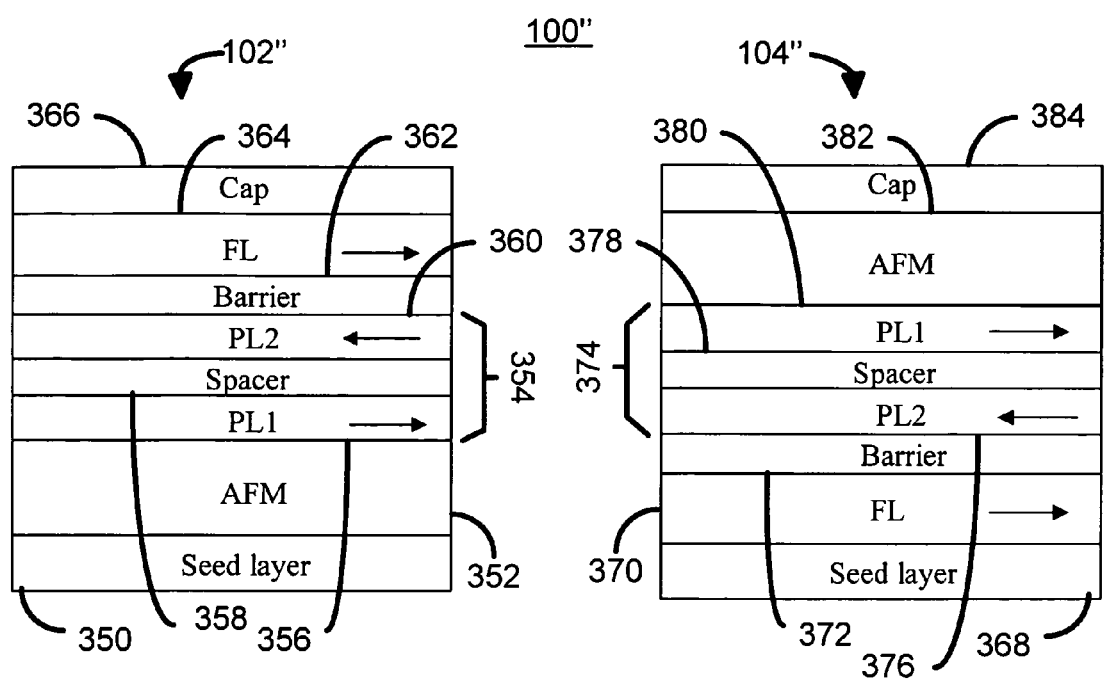
FIG. 12 is a cross-sectional view of a portion of another embodiment of a magnetic storage cell in accordance with the present invention.

FIG. 12 is a cross-sectional view of a portion of another embodiment of a magnetic storage cell 100" in accordance with the present invention. The magnetic storage cell 100" includes magnetic elements 102" and 104". The magnetic elements 102" and 104" shown are TMR junctions. Thus, the magnetic storage cell 102" includes a seed layer 350, antiferromagnetic (AFM) layer 352, a reference (pinned) layer 354, a tunneling barrier layer 362, a data storage (free) layer 364 and capping layer 366. The reference layer 354 is a synthetic pinned layer includes ferromagnetic layers 356 and 360 separated by a nonmagnetic spacer layer 358. In the embodiment shown, the magnetizations of the ferromagnetic layers 356 and 360 are aligned antiparallel. Similarly, the magnetic storage cell 104" includes seed layer 368, data storage (free) layer 370, tunneling barrier layer 372, reference (pinned) layer 374, AFM layer 382, and a capping layer 384. The reference layer 374 is a synthetic pinned layer includes ferromagnetic layers 376 and 380 separated by a nonmagnetic spacer layer 378. In the embodiment shown, the magnetizations of the ferromagnetic layers 376 and 380 are aligned antiparallel. In addition, although shown side-by-side in FIG. 12, the magnetic elements 102" and 104" may be disposed vertically, preferably with the magnetic element 102" residing above the magnetic element 104".

As can be seen in FIG. 12, the magnetic element 102" is bottom pinned (reference layer 354 residing below/closer to the substrate) while the magnetic element 104" is top pinned. As a result, the magnetizations of the data storage layers 364 and 370 are parallel or anti-parallel to the magnetization of the reference layers 354 and 374, respectively, during writing operation utilizing spin transferred current induced switching.

Figure 13:
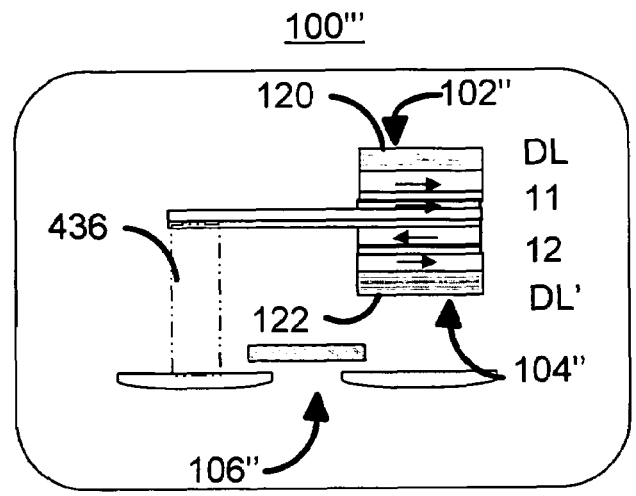
FIG. 13 is a cross-sectional view of a portion of another embodiment of a magnetic storage cell in accordance with the present invention.
Figure 14:
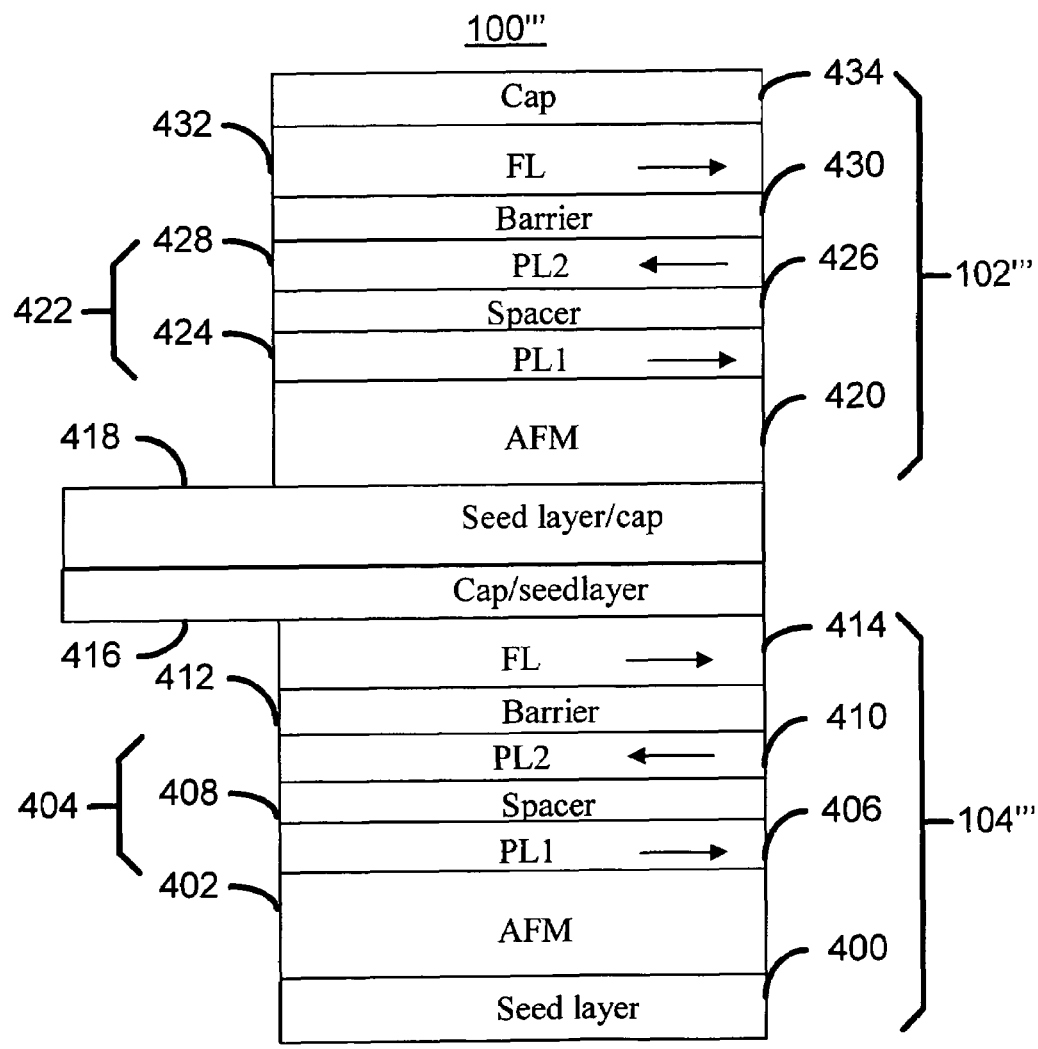
FIG. 14 is a more detailed cross-sectional view of a portion of one embodiment of a magnetic storage cell in accordance with the present invention.

FIGS. 13 and 14 are cross-sectional views of a portion of another embodiment of a magnetic storage cell 100''' in accordance with the present invention. Thus, the magnetic elements 102" and 104" as well as transistor 106' and contact 436 are shown. The magnetic element 104" includes a seed layer 400, AFM layer 402, a reference (pinned) layer 404, a tunneling barrier layer 412, a data storage (free) layer 414 and capping layer 416. The reference layer 404 is a synthetic pinned layer includes ferromagnetic layers 406 and 410 separated by a nonmagnetic spacer layer 408. In the embodiment shown, the magnetizations of the ferromagnetic layers 406 and 410 are aligned antiparallel. Similarly, the magnetic storage cell 102" includes seed layer 418, AFM layer 420, reference (pinned) layer 422, tunneling barrier layer 430, data storage (free) layer 432, and a capping layer 434. The reference layer 422 is a synthetic pinned layer includes ferromagnetic layers 424 and 428 separated by a nonmagnetic spacer layer 426. In the embodiment shown, the magnetizations of the ferromagnetic layers 424 and 428 are aligned antiparallel. For clarity, the magnetic storage cell 100''' is depicted in the context of the magnetic memory 110 such that data lines 120 and 122 are shown.

In the magnetic storage cell 100''' depicted, the magnetic elements 102''' and 104''' share a single cell plate, formed by the layers 416 and 418. As a result, the cell 100'' may be more easily manufactured. Furthermore, the fluctuations in the characteristics of the magnetic elements 102' and 104' may be is reduced.

Figure 15:
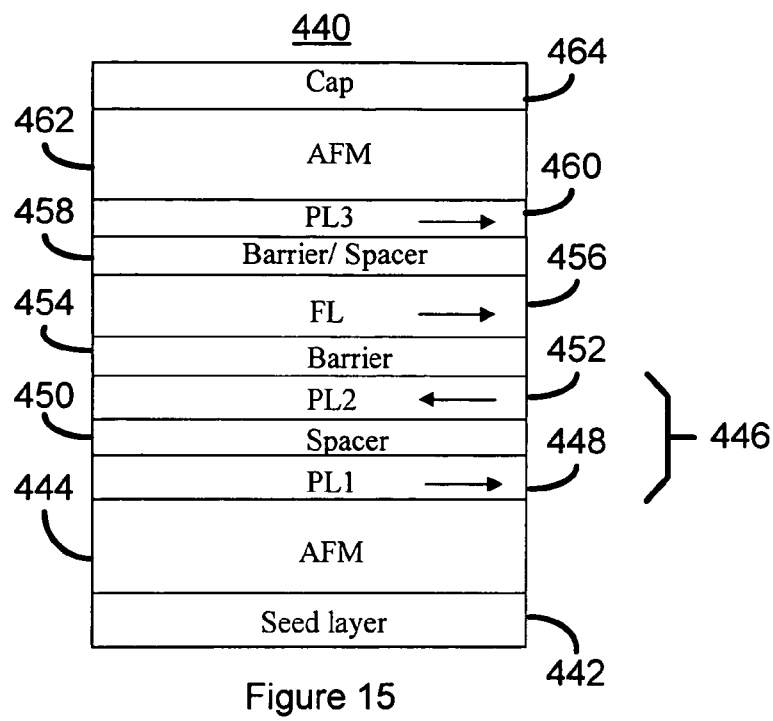
FIG. 15 is a cross-sectional view of a portion of another embodiment of a magnetic element in accordance with the present invention.

FIG. 15 is a cross-sectional view of a portion of another embodiment of a magnetic element 440 in accordance with the present invention. The magnetic element 440 might be used for the magnetic element 102 or the magnetic element 104. The magnetic element 440 includes seed layer 442, AFM layer 444, reference layer 446, tunneling barrier layer 454, data storage (free) layer 456, an additional spacer layer 458 that is either a tunneling barrier layer or a nonmagnetic conductive spacer layer, another reference (pinned) layer 460, AFM layer 462, and a capping layer 464. The reference layer 446 is a synthetic layer including ferromagnetic layers 448 and 453 separated by a conductive, nonmagnetic spacer layer 450.

The magnetic element 440 can be relatively easily manufactured. In addition, the spin transfer induced switching current of the magnetic element 440 is reduced. As a result, the write current required for writing to the magnetic element 440 is significantly reduced. Consequently, the density of a magnetic memory utilizing the magnetic element 440 may be increased due in part to the reduced size taken up by selection transistors 106. Moreover, the power consumption of magnetic memories using the magnetic storage cells 100 may be significantly reduced.

Figure 16:
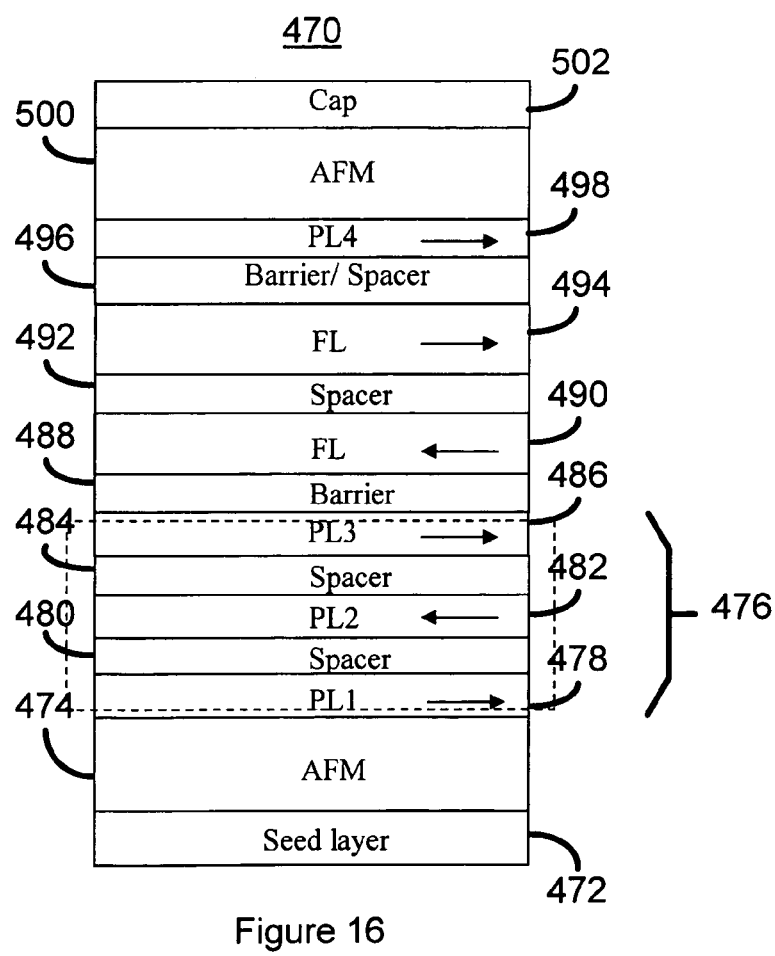
FIG. 16 is a cross-sectional view of a portion of another embodiment of a magnetic element in accordance with the present invention.

FIG. 16 is a cross-sectional view of a portion of another embodiment of a magnetic element 470 in accordance with the present invention. The magnetic element 470 might be used for the magnetic element 102 or the magnetic element 104. The magnetic element 470 includes seed layer 472, AFM layer 474, reference layer 476, tunneling barrier layer 488, data storage (free) layer 490, a spacer layer 492, an additional free layer 494, a layer 496 that is either a tunneling barrier layer or a nonmagnetic conductive spacer layer, another reference (pinned) layer 498, AFM layer 500, and a capping layer 502. The reference layer 476 is a synthetic layer including ferromagnetic layers 478, 482, and 486 separated by a conductive, nonmagnetic spacer layer 450.

The magnetic element 470 can be relatively easily manufactured. In addition, spin transfer induced switching current of the magnetic element 470 is reduced. As a result, the write current required for writing to the magnetic element 470 is significantly reduced. Consequently, the density of a magnetic memory utilizing the magnetic element 470 may be increased due in part to the reduced size taken up by selection transistors 106 and the power consumption of the magnetic memories may be significantly lowered.

For the magnetic elements 102, 102', 102", 102'", 104, 104', 104", and 104'" various materials can be used for various layers. The data storage layers, or free layers, 414, 432, 456, 490, and/or 494 preferably include at least one of Co, Fe, and Ni. In some embodiments, the free layer 414, 432, 456, 490, and/or 494 may include at least one amorphous forming element, preferably at a concentration of not more than thirty atomic percent. In one embodiment, the amorphous forming element includes boron. Utilizing the concentrations of the amorphous forming element, the saturation magnetization of the free layer 414, 432, 456, 490, and/or 494 may be engineered to reside between four hundred and one thousand five hundred emu/cm$^3$. Furthermore, the free layer 414, 432, 456, 490, and/or 494 may be a single layer, for example of ferromagnetic or ferrimagnetic material. Such a ferromagnetic material may include at least one of Co, CoFe with five to forty atomic percent Fe, CoFeB with five to forty atomic percent Fe and five to thirty atomic percent B, CoFeTa with five to forty atomic percent Fe and five to thirty atomic percent Ta, NiFe with approximately twenty atomic percent Fe, CoPt with five to forty atomic percent Pt, CoPd with five to forty atomic percent Pd, FePt with five to forty atomic percent Pt, $Co_2MnAl$, $Co_2MnSi$, or $Co_2CrAl$, $Co_2CrSi$, $Co_2FeAl$ and $Co_2FeSi$. The ferrimagnetic material may include at least one of CoGd with fifteen to thirty atomic percent Gd and FeGd with ten to forty atomic percent Gd.

The free layer 414, 432, 456, 490, and/or 494 may also be a multilayer structure. Such a multilayer may be made out of ferromagnetic layers only, or a combination of ferromagnetic layers and nonmagnetic layers. Such a ferromagnetic material may include at least one of Co, CoFe with five to forty atomic percent Fe, CoFeB with five to forty atomic percent Fe and five to thirty atomic percent B, CoFeTa with five to forty atomic percent Fe and five to thirty atomic percent Ta, NiFe with approximately twenty atomic percent Fe, CoPt with five to forty atomic percent Pt, CoPd with five to forty atomic percent Pd, FePt with five to forty atomic percent Pt, $Co_2MnAl$, $Co_2MnSi$, or $Co_2CrAl$, $Co_2CrSi$, $Co_2FeAl$ and $Co_2FeSi$. In one embodiment, the free layer 414, 432, 456, 490, and/or 494 is a multilayer structure including ferromagnetic layers and at least one nonmagnetic layer separating each of a portion of the plurality of ferromagnetic layers. In such an embodiment, the nonmagnetic layer includes at least one of Ru, Rh, Re, Cr, and Cu. Also in such an embodiment, the magnetizations of alternating ferromagnetic layers are aligned antiparallel. However, another alignment of magnetizations may be used.

The reference layers, or pinned layers 404, 422, 446, 476, and/or 498 preferably includes at least one of Co, Fe, and Ni. In some embodiments, the pinned layers 404, 422, 446, 476, and/or 498 may include at least one amorphous forming element, preferably at a concentration of not more than thirty atomic percent. In one embodiment, the amorphous forming element includes boron. Furthermore, the pinned layers 404, 422, 446, 476, and/or 498 may be a single layer, for example of ferromagnetic or ferrimagnetic material. Such a ferromagnetic material may include at least one of Co, CoFe with five to forty atomic percent Fe, CoFeB with five to forty atomic percent Fe and five to thirty atomic percent B, CoFeTa with five to forty atomic percent Fe and five to thirty atomic percent Ta, NiFe with approximately twenty atomic percent Fe, CoPt with five to forty atomic percent Pt, CoPd with five to forty atomic percent Pd, FePt with five to forty atomic percent Pt, $Co_2MnAl$, $Co_2MnSi$, or $Co_2CrAl$, $Co_2CrSi$, $Co_2FeAl$ and $Co_2FeSi$. The ferrimagnetic material may include at least one of CoGd with fifteen to thirty atomic percent Gd and FeGd with ten to forty atomic percent Gd.

The pinned layers 404, 422, 446, 476, and/or 498 may also be a multilayer structure. Such a multilayer may be made out of ferromagnetic layers only, or a combination of ferromagnetic layers and nonmagnetic layers. Such a ferromagnetic material may include at least one of Co, CoFe with five to forty atomic percent Fe, CoFeB with five to forty atomic percent Fe and five to thirty atomic percent B, CoFeTa with five to forty atomic percent Fe and five to thirty atomic percent Ta, NiFe with approximately twenty atomic percent Fe, CoPt with five to forty atomic percent Pt, CoPd with five to forty atomic percent Pd, FePt with five to forty atomic percent Pt, $Co_2MnAl$, $Co_2MnSi$, or $Co_2CrAl$, $Co_2CrSi$, $Co_2FeAl$ and $Co_2FeSi$. In one embodiment, the pinned layers 404, 422, 446, 476, and/or 498 is a multilayer structure including ferromagnetic layers and at least one nonmagnetic layer separating each of a portion of the plurality of ferromagnetic layers. In such an embodiment, the nonmagnetic layer includes at least one of Ru, Rh, Re, Cr, and Cu. Also in such an embodiment, the magnetizations of alternating ferromagnetic layers are aligned antiparallel. However, another alignment of magnetizations may be used.

The magnetic elements 102, 102', 102", 102'", 104, 104', 104", and 104'" may also include one or more tunneling barrier layer 362, 372, 412, 430, 454, 458, 488, and/or 496. The tunneling barrier layer 362, 372, 412, 430, 454, 458, 488, and/or 496 may include at least one of AlO with forty to seventy atomic percent O, MgO with thirty to sixty atomic percent O, and AlON with forty to seventy atomic percent O and two to thirty atomic percent N, AlN with thirty to sixty atomic percent N, AlZrO, AlHfO, AlTiO, and AlTaO. In some embodiments, the tunneling barrier layer 362, 372, 412, 430, 454, 458, 488, and/or 496 may be made up of a single layer or multiple layers. The tunneling barrier layer 362, 372, 412, 430, 454, 458, 488, and/or 496 preferably has a thickness of at least five Angstroms and not more than forty Angstroms. In addition, the tunneling barrier layer 362, 372, 412, 430, 454, 458, 488, and/or 496 preferably has a low resistance-area product. In a preferred embodiment, this resistance-area product is between ten and one hundred $\Omega$-$\mu m^2$. The spacer layer 496 might be conductive and include at least one of Cu, Ag, Pt, Al, Ru, Re, Rh, Ta, and Ti or their alloys. The spacer layer 496 may also include a nano-oxide layer (NOL), described below.

If a NOL is to be used for the spacer layer 496, the NOL could be formed by depositing original metal starting material and then oxidizing the deposited films using natural oxidation and/or plasma oxidation. In another embodiment, the NOL may be formed using radio frequency sputtering original oxide starting material. In another embodiment, the NOL may be either magnetic, at least partially. The starting metal material could be those similar those used in the pinned or free layers, such as magnetic material CoFe, CoFeB, and non magnetic material Al, Ta, Ru, and Ti. NOL might also be Cu/CoFe, FeSi, Al, Ta, Ru or Ti/NOL/Cu in structure for instance.

In some embodiments, the magnetic element 102, 102', 120', 102''', 104, 104', 104'' and/or 104''' also includes at least one spacer layer 492. The spacer layer 492 preferably includes at least one of Cu, Ag, Pt, Al, Ru, Re, Rh, Ta, and Ti or their alloys.

The magnetic elements 102, 102', 102'', 102''', 104, 104', 104'', and 104''' also include AFM layers 352, 382, 402, 420, 444, 462, 474, and 500. In a preferred embodiment, at least one of the AFM layers 352, 382, 402, 420, 444, 462, 474, and 500 includes PtMn, IrMn, or the like.

Figure 17:
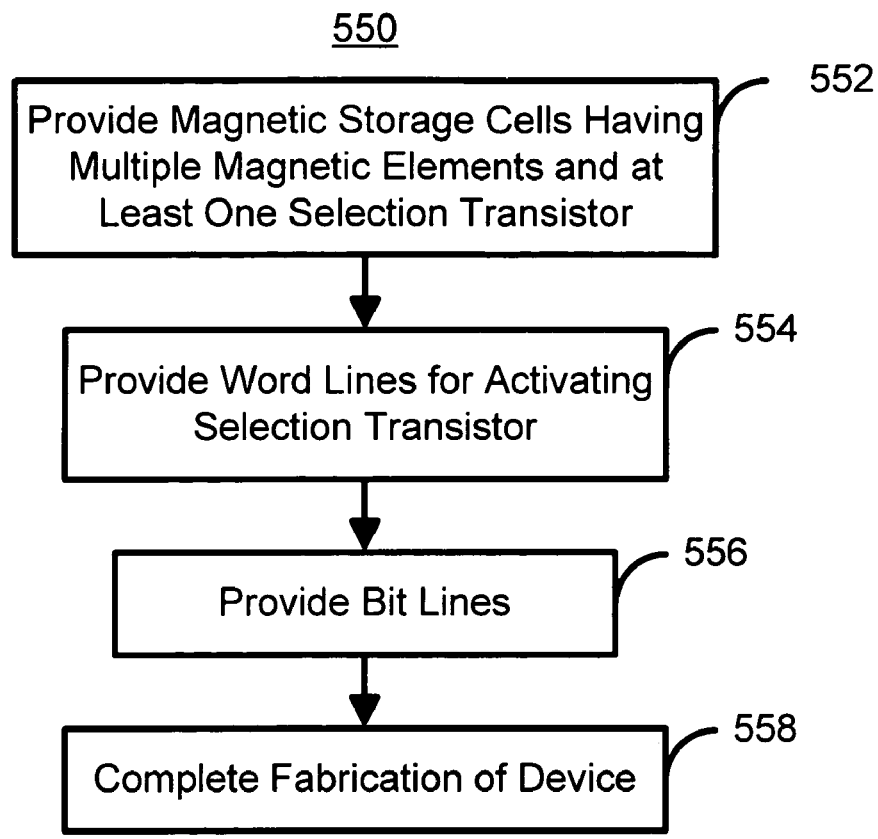
FIG. 17 is a flow chart depicting on embodiment of a method in accordance with the present invention for providing a magnetic memory.

FIG. 17 is a flow chart depicting on embodiment of a method 550 in accordance with the present invention for providing a magnetic memory. A plurality of magnetic storage cells 100 are provided, via step 552. Providing the magnetic storage cells 100 includes providing a plurality of magnetic elements 102 and 104 capable of being programmed using spin transfer induced switching by a write current driven through the magnetic element. Each of the magnetic elements 102 and 104 has a first end and a second end. The at least one selection transistor is also coupled to the first end of each of the plurality of magnetic elements. A plurality of word lines is provided such that the word lines are coupled with the selection transistors and for selectively enabling a portion of the plurality of selection transistors, via step 554. A plurality of bit lines is provided, via step 556. The device is then completed, via step 558.

Using the method 550, the magnetic memory cell 100, as well as the memories 110, 140, 170, 200, 240, and 280 may be provided. Consequently, a magnetic memory that utilizes a localized phenomenon (spin transfer) for switching may be provided. The write current required for current induced switching of the magnetization of the data storage layers has decreased as the device density grows following the scaling down rule compatible to semiconductor or CMOS technology evolution. As a result, the magnetic memories 110, 140, 170, 200, 240, and 280 formed using the method 550 may have lower power consumption and, therefore, smaller dimensions for the transistor 106. In addition faster write and readout times, as well as the other advantages described above, may be achieved for the magnetic memories 110, 140, 170, 200, 240, and 280.

Figure 18:
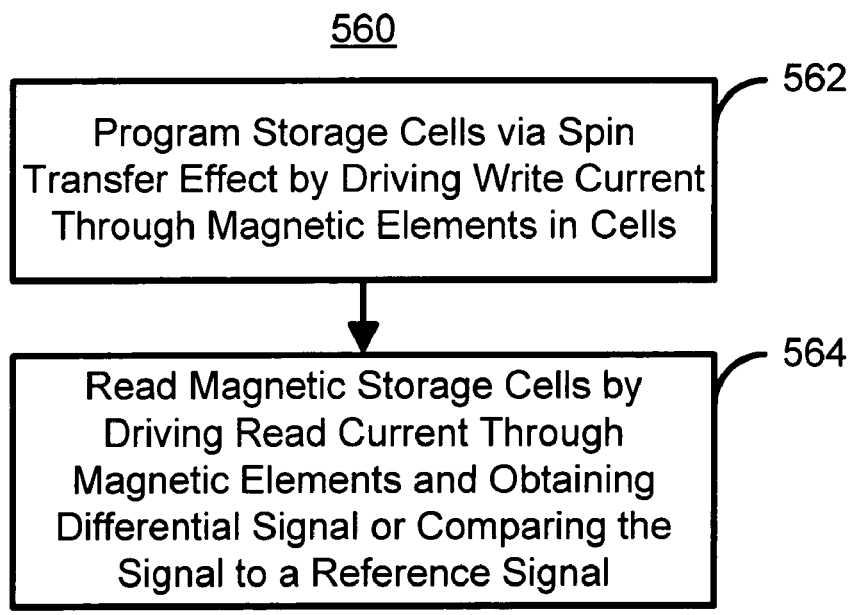
FIG. 18 is a flow chart depicting on embodiment of a method in accordance with the present invention for utilizing a magnetic memory.

FIG. 18 is a flow chart depicting on embodiment of a method 560 in accordance with the present invention for utilizing a magnetic memory, such as the magnetic memory 110, 140, 170, 200, 240, or 280. For a programming operation, a write current is driven through a portion of the plurality of magnetic storage cells 100, via step 562. Each magnetic storage cell includes a plurality of magnetic elements, such as the magnetic elements 102 and 104, and at least one selection transistor 106. The magnetic elements 102 and 104 are capable of being programmed using spin transfer induced switching by the write current driven through the magnetic element 102 and 104. In addition, each magnetic element 102 and 104 has a first end and a second end. The selection transistor 106 is coupled to the first end of each magnetic element 102 and 104. Note that the details of step 562 may depend upon the magnetic memory 110, 140, 170, 200, 240, or 280 being programmed. For example, the combination of the lines and transistors activated or disabled to drive the write current through the desired magnetic elements 102 and 104 in step 562 may depend upon the memory 110, 140, 170, 200, 240, or 280 being programmed.

For a read operation, a read current is driven through the magnetic elements 102 and 104 of at least one magnetic storage cell 100 and data read by determining a differential signal based upon the read signal or by comparing the read signal to a reference signal, via step 564. Preferably, a differential signal is obtained in step 564 for the memories 110, 140, 170, and 280. The differential signal indicates the difference in the resistances of the magnetic elements 102 and 104 for given cells. The details of step 564 may depend upon the magnetic memory 110, 140, 170, or 280 being read. For example, the combination of the lines and transistors activated or disabled to drive the read current through the desired magnetic elements 102 and 104 and output the differential signal in step 564 may depend upon the memory 110, 140, 170 or 280 being read.

For the magnetic memories 200 and 240 data are read in step 564 by comparing the readout signal to a reference signal. The voltage signal indicates the difference in the resistances of the magnetic elements 102 and 104 for given cells. The details of step 564 may depend upon the magnetic memory 200 and 240 being read. For example, the combination of the lines and transistors activated or disabled to establish the read voltage through the desired magnetic elements 102 and 104 and output the voltage signal in step 564 may depend upon the memory 200 and 240 being read.

Thus, using the method 560, the memories 110, 140, 170, 200, 240 and 280 may be programmed or read. The method 560 utilizes a differential scheme for reading data from some memories, and compares the read signal to a reference signal for other memories. Because both magnetic elements 102 and 104 share one selection transistor 106, the noise from the fluctuation in the characteristics of the transistor may be reduced or eliminated. In addition, the time delay due to the stray capacitance of the data line may be less than one nano-second, providing an advantage of high speed readout characteristics of this memory device.

A method and system for providing and using a magnetic memory has been disclosed. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

We claim:

1. A magnetic memory comprising:
   a plurality of magnetic storage cells, each of the plurality of magnetic storage cells including a plurality of magnetic elements capable of being programmed using spin transfer induced switching by a write current driven through the magnetic element, each of the plurality of magnetic elements having a first end and a second end, and at least one selection transistor coupled to the first end of each of the plurality of magnetic elements, the plurality of magnetic elements including at least a first magnetic element and a second magnetic element;
   a plurality of word lines coupled with the plurality of selection transistors and for selectively enabling a portion of the plurality of selection transistors;
   a plurality of bit lines;
   a plurality of bit line selection transistors coupled with the plurality of bit lines, for selectively enabling a portion of the plurality of bit lines; and a plurality of data lines for each of the plurality of magnetic storage cells, a first data line of the plurality of data lines coupled with the second end of the first magnetic element and a second data line of the plurality of data lines coupled with the second end of the second magnetic element, the plurality of data lines for providing a write current during writing and a sense current during reading of the plurality of magnetic storage cells.

2. The magnetic memory of claim 1 wherein the plurality of magnetic storage cells are organized into pairs including a first magnetic storage cell and a second magnetic storage cell, wherein the selection transistor of the first magnetic storage cell and the selection transistor of the second magnetic storage cell share a drain.

3. The magnetic memory of claim 1 wherein the plurality of bit lines include a plurality of subsidiary bit lines, each of the subsidiary bit lines coupled with a portion of the plurality of magnetic elements, the plurality of bit line selection transistors corresponding to the plurality of subsidiary bit lines.

4. The magnetic memory of claim 3 wherein the plurality of data lines include a plurality of subsidiary data lines, the plurality of subsidiary data lines including the first data line and the second data line for a portion of the plurality of magnetic storage cells.

5. The magnetic memory of claim 1 wherein the first data line is coupled to ground.

6. The magnetic memory of claim 5 wherein the plurality of bit lines are coupled to a plurality of differential sense amplifiers.

7. The magnetic memory of claim 5 wherein each of the plurality of bit lines are coupled to each of a plurality of differential sense amplifiers.

8. The magnetic memory of claim 1 wherein the plurality of bit lines are coupled with at least one current converting circuit.

9. The magnetic element of claim 1 wherein the first data line is a separate data line for each of the plurality of magnetic storage cells and wherein the second data line is a common data line for a portion of the plurality of magnetic storage cells.

10. A magnetic memory comprising:

a plurality of magnetic storage cells, each of the plurality of magnetic storage cells including a plurality of magnetic elements capable of being programmed using spin transfer induced switching by a write current driven through the magnetic element, each of the plurality of magnetic elements having a first end and a second end, and at least one selection transistor coupled to the first end of each of the plurality of magnetic elements; and a plurality of word lines coupled with the plurality of selection transistors and for selectively enabling a portion of the plurality of selection transistors;

a plurality of bit lines;

wherein the plurality of magnetic elements include a first magnetic element and a second magnetic element and wherein the at least one selection transistor includes a single selection transistor; and wherein the first magnetic element includes a first storage layer having a first magnetization and the second magnetic element includes a second storage layer having a second storage layer, the first magnetization aligned substantially antiparallel with the second magnetization.

11. A magnetic memory comprising:

a plurality of magnetic storage cells, each of the plurality of magnetic storage cells including a plurality of magnetic elements capable of being programmed using spin transfer induced switching by a write current driven through the magnetic element, each of the plurality of magnetic elements having a first end and a second end, and at least one selection transistor coupled to the first end of each of the plurality of magnetic elements;

a plurality of word lines coupled with the plurality of selection transistors and for selectively enabling a portion of the plurality of selection transistors; and a plurality of bit lines wherein a first magnetic element of the plurality of magnetic elements is disposed substantially directly above a second magnetic element of the plurality of magnetic elements; and wherein each of the first magnetic element and the second magnetic element includes a tunneling magnetoresistive junction.

12. The magnetic memory of claim 11 wherein the tunneling magnetoresistive junctions includes a pinned layer, a tunneling barrier layer, and a free layer, the tunneling barrier layer residing between the pinned layer and the free layer.

13. The magnetic memory of claim 12 wherein the pinned layer is a synthetic pinned layer including a first magnetic layer, a second magnetic layer, and a nonmagnetic layer between the first magnetic layer and the second magnetic layer.

14. The magnetic memory of claim 12 wherein the pinned layer of the first magnetoresistive storage element resides above the free layer of the first magnetoresistive storage element and wherein the pinned layer of the second magnetoresistive storage element resides below the free layer of the second magnetoresistive storage element.

15. A magnetic memory comprising:

a plurality of magnetic storage cells, each of the plurality of magnetic storage cells including a plurality of magnetic elements capable of being programmed using spin transfer induced switching by a write current driven through the magnetic element, each of the plurality of magnetic elements having a first end and a second end, and at least one selection transistor coupled to the first end of each of the plurality of magnetic elements;

a plurality of word lines coupled with the plurality of selection transistors and for selectively enabling a portion of the plurality of selection transistors; and a plurality of bit lines wherein a first magnetic element of the plurality of magnetic elements is disposed substantially directly above a second magnetic element of the plurality of magnetic elements; and wherein the first magnetoresistive storage element and the second magnetoresistive storage element each include a separate cell plate and are separated by an insulating layer.

16. A magnetic memory comprising:

a plurality of magnetic storage cells, each of the plurality of magnetic storage cells including a plurality of magnetic elements capable of being programmed using spin transfer induced switching by a write current driven through the magnetic element, each of the plurality of magnetic elements having a first end and a second end, and at least one selection transistor coupled to the first end of each of the plurality of magnetic elements;

a plurality of word lines coupled with the plurality of selection transistors and for selectively enabling a portion of the plurality of selection transistors; and a plurality of bit lines wherein a first magnetic element of the plurality of magnetic elements is disposed substantially directly above a second magnetic element of the plurality of magnetic elements; and wherein the first magnetoresistive storage element and the second magnetoresistive storage element each share a cell plate.

17. A magnetic memory comprising:

a plurality of magnetic storage cells, each of the plurality of magnetic storage cells including a plurality of magnetic elements capable of being programmed using spin transfer induced switching by a write current driven through the magnetic element, each of the plurality of magnetic elements having a first end and a second end, and at least one selection transistor coupled to the first end of each of the plurality of magnetic elements;

a plurality of word lines coupled with the plurality of selection transistors and for selectively enabling a portion of the plurality of selection transistors; and a plurality of bit lines;

at least one of wherein the plurality of magnetic elements include a plurality of dual tunneling magnetoresistive junctions, wherein each of the plurality of magnetic elements includes a first pinned layer, a tunneling barrier layer, a free layer, a nonmagnetic spacer layer, and a second pinned layer, the tunneling barrier layer residing between the free layer and the first pinned layer, the nonmagnetic spacer layer residing between the second pinned layer and the free layer, wherein each of the plurality of magnetic elements include a plurality of tunneling magnetoresistive junctions, each of the plurality of tunneling magnetoresistive junctions being separated by a nonmagnetic layer, wherein each of the plurality of magnetic elements include at least one tunneling magnetoresistive junction and at least one spin valve, each of the at least one tunneling magnetoresistive junction and the at least one spin valve being separated by a nonmagnetic spacer layer, wherein each of the plurality of magnetic elements includes a free layer, the free layer including an amorphous forming element having a concentration of not more than thirty atomic percent and at least one of Co, Fe, and Ni, wherein each of the plurality of magnetic elements includes a free layer, the free layer including an amorphous forming element and at least one of Co, Fe, and Ni, the amorphous forming element including boron, wherein each of the plurality of magnetic elements includes a free layer, the free layer including an amorphous forming element and at least one of Co, Fe, and Ni, the free layer having a saturation magnetization of between four hundred and one thousand five hundred emu/cm$^3$, wherein each of the plurality of magnetic elements includes a free layer, the free layer including at least one of Co, Fe, and Ni and being a multilayer including a plurality of layers, wherein each of the plurality of magnetic elements includes a free layer and a pinned layer, each of the pinned layer and the free layer including at least one of Co, Fe, and Ni and the pinned layer is a multilayer including a plurality of layers, and wherein each of the plurality of magnetic elements includes a free layer, a pinned layer and at least one nonmagnetic spacer layer including at least one nano-oxide layer, each of the free layer and the pinned layer including at least one of Co, Fe, and Ni.

18. The magnetic memory of claim 17 wherein each of the plurality of dual tunneling magnetoresistive junctions includes a synthetic pinned layer including a first magnetic layer, a second magnetic layer, and a nonmagnetic spacer layer between the first magnetic layer and the second magnetic layer.

19. The magnetic memory of claim 17 wherein the first pinned layer is a synthetic pinned layer including a first magnetic layer, a second magnetic layer, and a nonmagnetic layer between the first magnetic layer and the second magnetic layer.

20. The magnetic memory of claim 17 wherein the plurality of layers include a plurality of ferromagnetic layers.

21. The magnetic memory of claim 20 wherein the plurality of ferromagnetic layers includes at least one of Co, CoFe with 5-40 atomic percent Fe, CoFeB with 5-40 atomic percent Fe and 5-30 atomic percent B, CoFeTa with 5-40 atomic percent Fe and 5-30 atomic percent Ta, NiFe with approximately 20 atomic percent Fe, CoPt with 5-40 atomic percent Pt, CoPd with 5-40 atomic percent Pd, FePt with 5-40 atomic percent Pt, Co$_2$MnAl, Co$_2$MnSi, or Co$_2$CrAl, Co$_2$CrSi, Co$_2$FeAl and Co$_2$FeSi.

22. The magnetic memory of claim 20 wherein the plurality of layers include at least one nonmagnetic layer separating a portion of the plurality of ferromagnetic layers.

23. The magnetic memory of claim 22 wherein the ferromagnetic material includes at least one of Co, CoFe with 5-40 atomic percent Fe, CoFeB with 5-40 atomic percent Fe and 5-30 atomic percent B, CoFeTa with 5-40 atomic percent Fe and 5-30 atomic percent Ta, NiFe with approximately 20 atomic percent Fe, CoPt with 5-40 atomic percent Pt, CoPd with 5-40 atomic percent Pd, FePt with 5-40 atomic percent Pt, Co$_2$MnAl, Co$_2$MnSi, or Co$_2$CrAl, Co$_2$CrSi, Co$_2$FeAl and Co$_2$FeSi.

24. The magnetic memory of claim 22 wherein the nonmagnetic layer includes at least one of Ru, Rh, Re, Cr and Cu.

25. The magnetic memory of claim 17 wherein the plurality of layers include a plurality of ferromagnetic layers.

26. The magnetic memory of claim 25 wherein the plurality of ferromagnetic layers includes at least one of Co, CoFe with 5-40 atomic percent Fe, CoFeB with 5-40 atomic percent Fe and 5-30 atomic percent B, CoFeTa with 5-40 atomic percent Fe and 5-30 atomic percent Ta, NiFe with approximately 20 atomic percent Fe, CoPt with 5-40 atomic percent Pt, CoPd with 5-40 atomic percent Pd, FePt with 5-40 atomic percent Pt, Co$_2$MnAl, Co$_2$MnSi, or Co$_2$CrAl, Co$_2$CrSi, Co$_2$FeAl and Co$_2$FeSi.

27. The magnetic memory of claim 25 wherein the plurality of layers include at least one nonmagnetic layer separating a portion of the plurality of ferromagnetic layers.

28. The magnetic memory of claim 27 wherein the ferromagnetic material includes at least one of Co, CoFe with 5-40 atomic percent Fe, CoFeB with 5-40 atomic percent Fe and 5-30 atomic percent B, CoFeTa with 5-40 atomic percent Fe and 5-30 atomic percent Ta, NiFe with approximately 20 atomic percent Fe, CoPt with 5-40 atomic percent Pt, CoPd with 5-40 atomic percent Pd, FePt with 5-40 atomic percent Pt, Co$_2$MnAl, Co$_2$MnSi, or Co$_2$CrAl, Co$_2$CrSi, Co$_2$FeAl and Co$_2$FeSi.

29. The magnetic memory of claim 27 wherein the nonmagnetic layer includes at least one of Ru, Re, and Cu.

30. A magnetic memory comprising:
a plurality of magnetic storage cells, each of the plurality of magnetic storage cells including a plurality of magnetic elements capable of being programmed using spin transfer induced switching by a write current driven through the magnetic element, each of the plurality of magnetic elements having a first end and a second end, and at least one selection transistor coupled to the first end of each of the plurality of magnetic elements;
a plurality of word lines coupled with the plurality of selection transistors and for selectively enabling a portion of the plurality of selection transistors; and
a plurality of bit lines;
wherein each of the plurality of magnetic elements includes a free layer, the free layer including at least one of Co, Fe, and Ni;
wherein each of the plurality of magnetic elements includes a pinned layer including at least one of Co, Fe, and Ni; and
wherein each of the plurality of magnetic elements includes at least one tunneling barrier layer.

31. The magnetic memory of claim 30 wherein the at least one tunneling barrier layer includes at least one of AlO with 40-70 atomic percent O, MgO with 30-60 atomic percent O, and AlON with 40-70 atomic percent O and 2-30 atomic percent N, AlN with 30-60 atomic percent N, AlZrO, AlHfO, AlTiO, and AlTaO.

32. The magnetic memory of claim 30 wherein the at least one tunneling barrier layer includes a plurality of layers.

33. The magnetic memory of claim 30 wherein the at least one tunneling barrier layer has a thickness of at least five Angstroms and not more than forty Angstroms.

34. The magnetic memory of claim 30 wherein the at least one tunneling barrier layer has a resistance-area product between ten and one hundred $\Omega\text{-}\mu m^2$.

35. A method for providing a magnetic memory comprising:
providing a plurality of magnetic storage cells, each of the plurality of magnetic storage cells including a plurality of magnetic elements capable of being programmed using spin transfer induced switching by a write current driven through the magnetic element, each of the plurality of magnetic elements having a first end and a second end, and at least one selection transistor coupled to the first end of each of the plurality of magnetic elements, the magnetic storage cell providing further including providing a first magnetic element and a second magnetic element and wherein the at least one selection transistor includes a single selection transistor;
providing a plurality of word lines coupled with the plurality of selection transistors and for selectively enabling a portion of the plurality of selection transistors;
providing a plurality of bit lines;
providing a plurality of bit line selection transistors coupled with the plurality of bit lines, for selectively enabling a portion of the plurality of bit lines; and
providing a plurality of data lines for each of the plurality of magnetic storage cells, a first data line of the plurality of data lines coupled with the second end of the first magnetic element and a second data line of the plurality of data lines coupled with the second end of the second magnetic element, the plurality of data lines for providing a write current during writing and a sense current during reading of the plurality of magnetic storage cells.

36. The method of claim 35 wherein providing the plurality of magnetic storage cells includes:
organizing the plurality of magnetic storage cells into pairs including a first magnetic storage cell and a second magnetic storage cell, the selection transistor of the first magnetic storage cell and the selection transistor of the second magnetic storage cell sharing a drain.

37. The method of claim 35 wherein providing the plurality of bit lines includes:
providing a plurality of subsidiary bit lines, each of the subsidiary bit lines coupled with a portion of the plurality of magnetic elements, the plurality of bit line selection transistors corresponding to the plurality of subsidiary bit lines.

38. The method of claim 35 wherein providing the plurality of data lines further includes:
providing a plurality of subsidiary data lines, the plurality of subsidiary data lines including the first data line and the second data line for a portion of the plurality of magnetic storage cells.

39. The method of claim 35 wherein providing plurality of data lines includes:
coupling the first data line to ground.

40. The method of claim 39 wherein providing the plurality of bit lines further includes:
coupling the plurality of bit lines to a plurality of differential sense amplifiers.

41. The method of claim 39 wherein each of the plurality of bit lines are coupled to each of a plurality of differential sense amplifiers.

42. The method of claim 35 further comprising:
coupling the plurality of bit lines with at least one current converting circuit.

43. The method element of claim 35 wherein the first data line is a separate data line for each of the plurality of magnetic storage cells and wherein the second data line is a common data line for a portion of the plurality of magnetic storage cells.

44. A method for providing a magnetic memory comprising:
providing a plurality of magnetic storage cells, each of the plurality of magnetic storage cells including a plurality of magnetic elements capable of being programmed using spin transfer induced switching by a write current driven through the magnetic element, each of the plurality of magnetic elements having a first end and a second end, and at least one selection transistor coupled to the first end of each of the plurality of magnetic elements, the magnetic storage cell providing further including providing a first magnetic element and a second magnetic element and wherein the at least one selection transistor includes a single selection transistor;
providing a plurality of word lines coupled with the plurality of selection transistors and for selectively enabling a portion of the plurality of selection transistors; and
providing a plurality of bit lines;
wherein providing the plurality of magnetic storage cells further includes:
providing the first magnetic element including a first storage layer having a first magnetization; and
providing the second magnetic element including a second storage layer having a second storage layer, the first magnetization aligned substantially antiparallel with the second magnetization.

45. A method for providing a magnetic memory comprising:
- providing a plurality of magnetic storage cells, each of the plurality of magnetic storage cells including a plurality of magnetic elements capable of being programmed using spin transfer induced switching by a write current driven through the magnetic element, each of the plurality of magnetic elements having a first end and a second end, and at least one selection transistor coupled to the first end of each of the plurality of magnetic elements, wherein providing the plurality of magnetic storage cells further includes providing a first magnetic element of the plurality of magnetic elements is disposed substantially directly above a second magnetic element of the plurality of magnetic elements;
- providing a plurality of word lines coupled with the plurality of selection transistors and for selectively enabling a portion of the plurality of selection transistors; and
- providing a plurality of bit lines;
- at least one of wherein each of the first magnetic element and the second magnetic element includes a tunneling magnetoresistive junctions; wherein the first magnetoresistive storage element and the second magnetoresistive storage element each include a separate cell plate and are separated by an insulating layer.

46. The method of claim 45 wherein the tunneling magnetoresistive junctions includes a pinned layer, a tunneling barrier layer, and a free layer, the tunneling barrier layer residing between the pinned layer and the free layer.

47. The method of claim 46 wherein the pinned layer is a synthetic pinned layer including a first magnetic layer, a second magnetic layer, and a nonmagnetic layer between the first magnetic layer and the second magnetic layer.

48. The method of claim 47 wherein the pinned layer of the first magnetoresistive storage element resides above the free layer of the first magnetoresistive storage element and wherein the pinned layer of the second magnetoresistive storage element resides below the free layer of the second magnetoresistive storage element.

49. A method for providing a magnetic memory comprising:
- providing a plurality of magnetic storage cells, each of the plurality of magnetic storage cells including a plurality of magnetic elements capable of being programmed using spin transfer induced switching by a write current driven through the magnetic element, each of the plurality of magnetic elements having a first end and a second end, and at least one selection transistor coupled to the first end of each of the plurality of magnetic elements;
- providing a plurality of word lines coupled with the plurality of selection transistors and for selectively enabling a portion of the plurality of selection transistors; and
- providing a plurality of bit lines;
- wherein the plurality of magnetic elements includes at least one of providing a plurality of dual tunneling magnetoresistive junctions; providing a first pinned layer, a tunneling barrier layer, a free layer, a nonmagnetic spacer layer, and a second pinned layer for each of the plurality of magnetic elements, the tunneling barrier layer residing between the free layer and the first pinned layer, the nonmagnetic spacer layer residing between the second pinned layer and the free layer; providing a plurality of tunneling magnetoresistive junctions for each or the plurality of magnetic storage cells, each of the plurality of tunneling magnetoresistive junctions being separated by a nonmagnetic layer; and providing at least one tunneling magnetoresistive junction and at least one spin valve, each of the at least one tunneling magnetoresistive junction and the at least one spin valve being separated by a nonmagnetic spacer layer.

\* \* \* \* \*